US012751293B2

(12) United States Patent
Liao

(10) Patent No.: US 12,751,293 B2
(45) Date of Patent: Sep. 29, 2026

(54) PACKAGE STRUCTURE WITH TRANSMISSION LINE AND METHOD FOR MANUFACTURING THE SAME

(71) Applicant: Taiwan Semiconductor Manufacturing Company, Ltd., Hsinchu (TW)

(72) Inventor: Wen-Shiang Liao, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 603 days.

(21) Appl. No.: 18/343,107

(22) Filed: Jun. 28, 2023

(65) Prior Publication Data

US 2025/0006669 A1 Jan. 2, 2025

(51) Int. Cl.
*H01L 23/34* (2006.01)
*H10W 44/20* (2026.01)
(Continued)

(52) U.S. Cl.
CPC .......... *H10W 44/20* (2026.01); *H10W 70/611* (2026.01); *H10W 70/65* (2026.01); (Continued)

(58) Field of Classification Search
CPC ............... H01L 23/66; H01L 23/49816; H01L 23/49822; H01L 23/49838; H01L 23/5383; H01L 23/5386; H01L 24/08; H01L 24/80; H01L 25/0652; H01L 2223/6611; H01L 2223/6616; H01L 2224/08145; H01L 2224/08155; H01L 2224/80894; H01L 2924/142; H01L 25/18; H01L 2225/06541; H01L 23/481; H01L 2224/80895; H01L 25/0655; H01L 23/5226; H01L 23/5384; H01L 24/16; H01L 2225/06517; H01L 2224/16145; H01L 2224/32145;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

| | | | | |
|---|---|---|---|---|
| EP | 3937231 | A2 * | 1/2022 | .......... H10W 72/019 |
| TW | 201836113 | A | 10/2018 | |
| TW | 202314986 | A | 4/2023 | |

*Primary Examiner* — Niki H Nguyen
(74) *Attorney, Agent, or Firm* — Birch, Stewart, Kolasch & Birch, LLP

(57) ABSTRACT

A package structure and a formation method are provided. The package structure includes a chip structure bonded to a substrate through dielectric-to-dielectric bonding and metal-to-metal bonding and interconnect dielectric layers formed over the chip structure. The package structure further includes interconnect conductive structures formed in the interconnect dielectric layers and a transmission line formed in the interconnect dielectric layers. The package structure further includes a magnetic structure formed in the interconnect dielectric layers and separated from the transmission line by the interconnect dielectric layers. In addition, the magnetic structure is electrically isolated from the chip structure and the interconnect conductive structures.

20 Claims, 24 Drawing Sheets

(51) Int. Cl.

| | |
|---|---|
| ***H10W 70/60*** | (2026.01) |
| ***H10W 70/65*** | (2026.01) |
| ***H10W 70/685*** | (2026.01) |
| ***H10W 90/00*** | (2026.01) |
| *H10W 80/00* | (2026.01) |

(52) U.S. Cl.
CPC ......... *H10W 70/685* (2026.01); *H10W 90/00* (2026.01); *H10W 90/701* (2026.01); *H10W 44/206* (2026.01); *H10W 44/209* (2026.01); *H10W 80/301* (2026.01); *H10W 90/792* (2026.01); *H10W 90/794* (2026.01)

(58) Field of Classification Search
CPC . H01L 2224/08225; H01L 2224/16225; H01L 2225/06513; H01L 2924/1431; H01L 2924/13091; H01L 21/486; H01L 24/73; H01L 23/3128; H01L 2224/08146; H01L 23/49827; H01L 23/528; H01L 23/585; H01L 24/19; H01L 2224/04105; H01L 2224/16146; H01L 24/13; H01L 2924/1433; H01L 2924/15311; H01L 2224/32137; H01L 2224/73204; H01L 2924/183; H01L 2224/83896; H01L 21/4853; H01L 2224/04042; H01L 2224/16227; H01L 21/2007; H01L 21/568; H01L 2224/24145; H01L 2224/73253; H01L 21/187; H01L 23/58; H01L 25/072; H01L 2924/1443; H01L 2224/0603; H01L 2224/06051; H01L 2224/0812; H01L 2224/08137; H01L 2224/0903; H01L 2224/09055; H01L 2224/1403; H01L 25/117
See application file for complete search history.

(56) References Cited

U.S. PATENT DOCUMENTS

| | | | | |
|---|---|---|---|---|
| 9,299,649 | B2 | 3/2016 | Chu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2018/0277500 | A1* | 9/2018 | Liao | H10W 44/20 |
| 2019/0131256 | A1* | 5/2019 | Liao | H10W 44/20 |
| 2019/0131277 | A1* | 5/2019 | Yang | H10P 74/273 |

* cited by examiner

PACKAGE STRUCTURE WITH TRANSMISSION LINE AND METHOD FOR MANUFACTURING THE SAME

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1K-1 illustrates an enlarged cross-sectional view of the magnetic structure and the transmission line of the package structure in accordance with some embodiments.

FIG. 1K-2 illustrates a diagrammatic perspective view of the magnetic structure in accordance with some embodiments.

FIG. 1K-3 illustrates a cross-sectional view of the magnetic structure shown along Y-Y' in FIG. 1K-2 in accordance with some embodiments.

FIG. 1K-2' illustrates a diagrammatic perspective view of the magnetic structure in accordance with some embodiments.

DETAILED DESCRIPTION

Figure 1A:
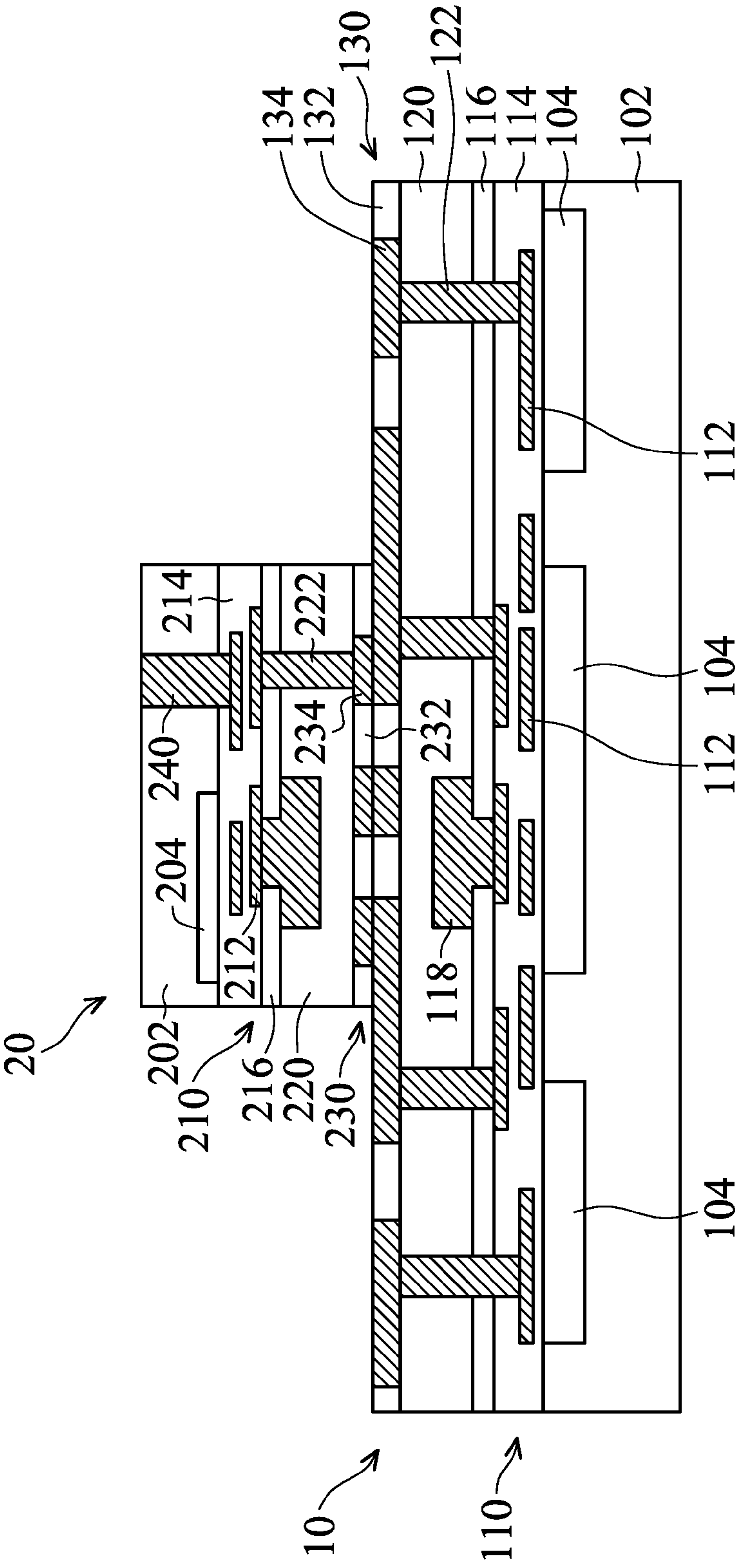
FIGS. 1A to 1K illustrate cross-sectional views of intermediate stages of manufacturing a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to package structures such as three-dimensional (3D) packaging, 3D-IC devices, and 2.5D packaging. Embodiments of the disclosure form a package structure including a substrate that carries one or more dies or packages and a protective element (such as a protective lid) aside the dies or packages. The protective element may also function as a warpage-control element and/or heat dissipation element.

Other features and processes may also be included. For example, testing structures may be included to aid in the verification testing of the 3D packaging, 3DIC devices, and/or 2.5 D packaging. The testing structures may include, for example, test pads formed in a redistribution layer or on a substrate that allows testing to be conducted using probes or probe cards and the like. Verification testing may be performed on intermediate structures as well as the final structure. Additionally, the structures and methods disclosed herein may be used in conjunction with testing methodologies that incorporate intermediate verification of known good dies to increase the yield and decrease costs.

Package structures and method for manufacturing the same are provided. The package structures may include a number of chip structures bonded to a substrate through hybrid-bonding. A transmission line is formed to connect at least two of the chip structures, and a magnetic structure is formed adjacent to the transmission line. The magnetic structure may help to improve the impedance of the transmission line, and therefore the current consumption of the resulting package structures may be reduced. Accordingly, the package structures may be applied to novel portable products, such as new-generation smart phones (e.g. 5G, 6G), tablets, cars, Internet of Things (IoT) devices, and cloud computing devices, with high clock frequency (e.g. greater than about 5 to about 10 GBPS)/wireline communication frequency.

FIGS. 1A to 1K illustrate cross-sectional views of intermediate stages of manufacturing a package structure 100 in accordance with some embodiments. FIGS. 1A to 1K have been simplified for the sake of clarity to better understand the inventive concepts of the present disclosure. Additional features may be included in the package structure 100, and some of the features described below may be replaced, modified, or eliminated.

First, a bottom wafer 10 is formed, as shown in FIG. 1A in accordance with some embodiments. In some embodiments, the bottom wafer includes device regions 104 formed in a substrate 102 and an interconnect structure 110 formed over the substrate 102. In some embodiments, the substrate 102 is a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond, in accordance with some embodiments. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the device regions 104 include various device elements, such as active devices, passive components, conductive portions, and/or insulating materials. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes may be performed to form the device elements, such as deposition, etching, implantation, photolithography, annealing, and other applicable processes. The transistors in device regions 104 may be used in various application, such as 5G devices, AI devices, Internet of things (IoT) devices, Car devices, SoC devices, High Performance Computing (HPC) devices, Network Processing Unit (NPU) devices, Graphics Processing Unit (GPU) devices, Central Processing Unit (CPU) devices, Field Programmable Gate Array (FPGA) devices, or the like. In addition, the transistors in different regions may have different functions.

The interconnect structure 110 may include multiple metallization layers, and each of the metallization layers includes metallization patterns formed in dielectric layers. The metallization patterns may be electrically coupled to the devices (e.g. transistors) in the device regions 104 of the substrate 102. In some embodiments, the interconnect structure 110 includes conductive structures 112, such as metal lines and metal vias, formed in one or more inter-metal dielectric (IMD) layers 114. In some embodiments, the conductive structures 112 may be configured to transfer signals or may be connected to ground. The interconnect structure 110 may be formed by damascene processes, such as a single damascene process, a dual damascene process, or the like.

In some embodiments, the IMD layers 114 include multiple dielectric layers made of low k dielectric materials having a k value lower than 7. In some embodiments, the IMD layers 114 are made of SiO2, SiN, SiCN, SiOC, SiOCN, or the like. The IMD layers 114 may be formed by chemical vapor deposition (CVD), physical vapor deposition, (PVD), atomic layer deposition (ALD), or other applicable processes. In some embodiments, the conductive structures 112 are made of W, Ru, Co, Cu, Ti, TiN, Ta, TaN, Mo, Ni, other applicable conductive materials, or a combination thereof. The conductive structures 112 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the interconnect structure 110 further includes a dielectric layer 116 and a conductive pad 118 formed over the dielectric layer 116. In addition, the conductive pad 118 further extends through the dielectric layer 116 and is connected to the conductive structures 112. In some embodiments, the conductive pad 118 is an Al pad. In some embodiments, the dielectric layer 116 is made of a low k dielectric material having a k value lower than 7. In some embodiments, the dielectric layer 116 is made of SiO2, SiN, SiCN, SiOC, SiOCN, or the like.

Afterwards, a dielectric layer 120 is formed over the dielectric layer 116 and the conductive pad 118, and conductive vias 122 are formed through the dielectric layer 120 in accordance with some embodiments. In some embodiments, the conductive vias 122 are electrically connected to the conductive structures 112. In some embodiments, the dielectric layer 120 includes multiple dielectric layers made of low k dielectric materials having a k value lower than 7. In some embodiments, the dielectric layer 120 is made of SiO2, SiN, SiCN, SiOC, SiOCN, or the like. In some embodiments, the conductive vias 122 are made of W, Ru, Co, Cu, Ti, TiN, Ta, TaN, Mo, Ni, other applicable conductive materials, or a combination thereof.

Next, a bonding structure 130 is formed over the interconnect structure 110 in accordance with some embodiments. In some embodiments, the bonding structure 130 includes a dielectric layer 132 and conductive pads 134 formed in the dielectric layer 132. In some embodiments, the conductive pads 134 are electrically connected to the conductive vias 122. In some embodiments, the dielectric layer 132 is made of a low k dielectric material having a k value lower than 7. In some embodiments, the dielectric layer 132 is made of $SiO_2$, SiN, SiCN, SiOC, SiOCN, or the like. In some embodiments, the conductive pads 134 are made of W, Ru, Co, Cu, Ti, TiN, Ta, TaN, Mo, Ni, other applicable conductive materials, or a combination thereof.

After the bottom wafer 10 is formed, a chip structure 20 is bonded to the bottom wafer 10 through dielectric-to-dielectric bonding and metal-to-metal bonding, as shown in FIG. 1A in accordance with some embodiments. In other words, the chip structure 20 is bonded to the bottom wafer 10 though bumpless bonding (i.e. no bumps are formed between the chip structure 20 and the bottom wafer 10) in accordance with some embodiments. Although only one chip structure 20 is shown in FIG. 1A, a number of the chip structures 20 may be bonded to the bottom wafer 10. In some embodiments, a pick-and-place process is performed, so that the known-good-dies can be picked up and placed onto the bottom wafer 10 as the chip structure 20.

More specifically, the chip structure 20 includes a substrate 202, a device region 204 formed in the substrate 202, an interconnect structure 210 formed over the substrate, and a bonding structure 230 formed over the interconnect structure 210 in accordance with some embodiments. Similar to the interconnect structure 110, the interconnect structure 210 includes IMD layers 214, dielectric layers 216 and 220, conductive structures 212, and a conductive via 222 in accordance with some embodiments. In addition, the bonding structure 230 includes a dielectric layer 232 and conductive pads 234 formed in the dielectric layer 232. In some embodiments, a through substrate via (TSV) 240 is formed through the substrate 202 and is electrically connected to the conductive structures 212 in the interconnect structure 210. In some embodiments, the TSV 240 is made of W, Ru, Co, Cu, Ti, TiN, Ta, TaN, Mo, Ni, other applicable conductive materials, or a combination thereof.

Processes and materials for forming the IMD layers 214, the dielectric layers 216 and 220, the conductive structures 212, the conductive via 222, the dielectric layer 232, and the conductive pads 234 may be similar to, or the same as, those for forming the IMD layers 114, the dielectric layers 116 and 118, the conductive structures 112, the conductive via 122, the dielectric layer 132, and the conductive pads 134 described previously and are not repeated herein.

In some embodiments, the chip structure 20 is bonded to the substrate 102 through hybrid bonding. The hybrid bonding may include metal-to-metal bonding and dielectric-to-dielectric bonding. That is, there is no solder elements formed between the chip structure 20 and the bottom wafer 10. In some embodiments, the hybrid bonding includes bonding the bonding structure 230 to the bonding structure 130 in accordance with some embodiments. In some embodiments, the dielectric layer 232 is bonded to the dielectric layer 132, and the conductive pads 234 are bonded to the conductive pads 134.

In some embodiments, a thermal operation is performed to enhance the bonding between the conductive pads 134 and 234. The temperature of the thermal operation may be in a range from about 100 degrees C. to about 700 degrees C., for about 1 hour to 3 hours.

Figure 1B:
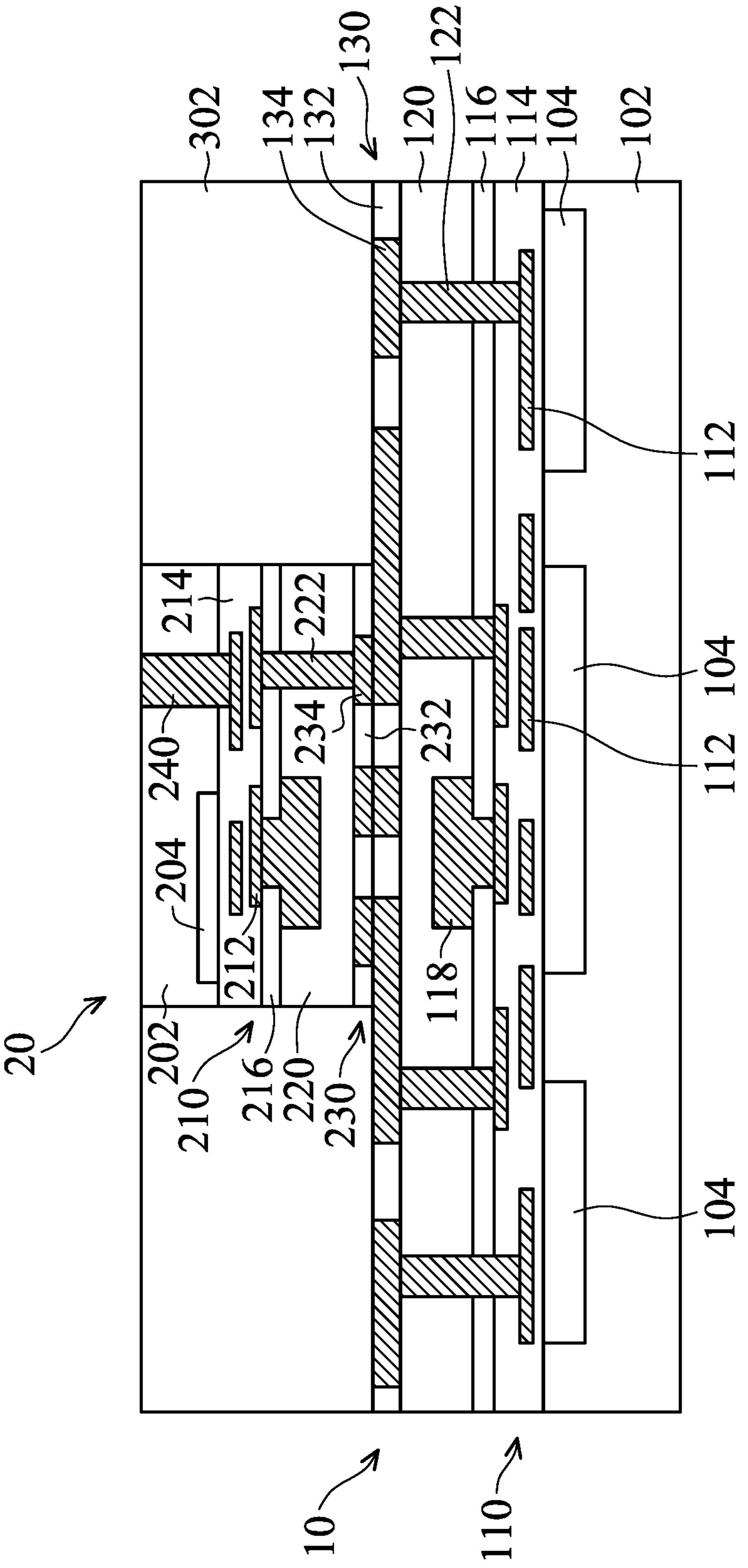

After the chip structure 20 is bonded to the interconnect structure 110 of the bottom wafer 10, a dielectric layer 302 is formed over the bonding structure 130, as shown in FIG. 1B in accordance with some embodiments. More specifically, the dielectric layer 302 is formed over the bonding structure 130 around the sidewalls of the chip structure 20 and over the top surface of the chip structure 20, and a planarization process is performed until the top surface of the chip structure 20 is exposed from the dielectric layer 302 in accordance with some embodiments.

In some embodiments, the dielectric layer 302 includes silicon oxide or a low-k dielectric material whose k-value (dielectric constant) is smaller than that of silicon oxide. In some embodiments, the low-k dielectric material includes a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. In some embodiments, the planarization process may include a grinding process, a chemical mechanical polishing (CMP) process, an etching process, a dry polishing process, one or more other applicable processes, or a combination thereof. In some embodiments, the dielectric layer 302 has a thickness in a range of about 10 μm to about 30 μm.

Figure 1C:
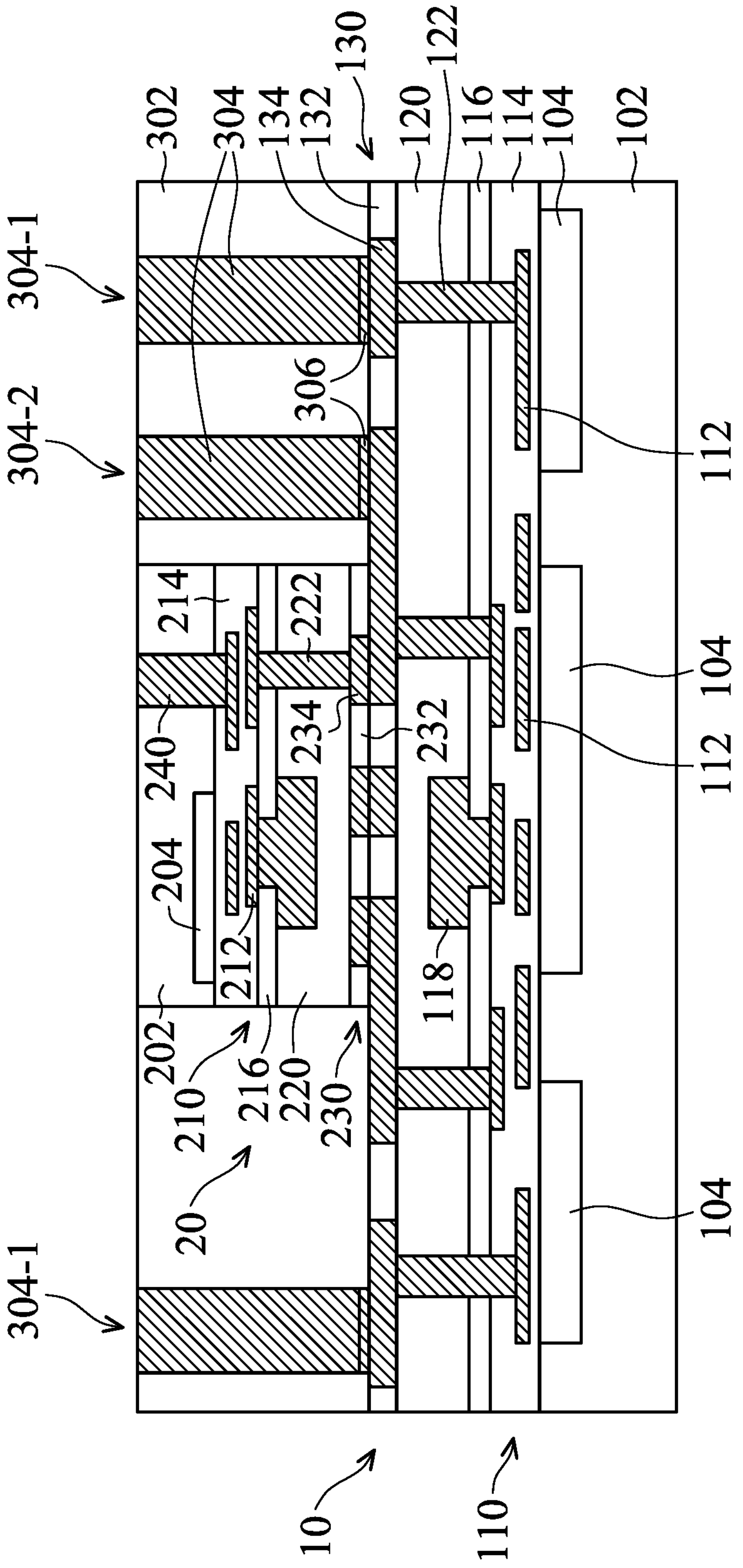

After the dielectric layer 302 is formed, through dielectric vias (TDV) 304 are formed through the dielectric layer 302, as shown in FIG. 1C in accordance with some embodiments. The through dielectric vias 304 are configured to vertically pass through the dielectric layer 302 to provide electrical connection in the vertical direction. In some embodiments, the through dielectric vias 304 are electrically connected to the conductive pads 134. In some embodiments, the through dielectric vias 304 includes through dielectric vias 304-1 connected to a ground voltage and through dielectric vias 304-2 connected to a power voltage.

More specifically, via trenches may be formed through the dielectric layer 302, and portions of the conductive pads 134 are exposed by the via trenches. Afterwards, seed layers 306 are formed over the exposed portions of the conductive pads 134, and conductive materials are formed over the seed layers 306 in the via trenches to form the through dielectric vias 304 in accordance with some embodiments.

In some embodiments, the seed layer 306 is made of titanium (Ti), cobalt (Co), copper (Cu), TiCu, or the like. In some embodiments, the through dielectric vias 304 are made of a conductive material, such as Cu, Al, W, or other applicable conductive materials. After the conductive material is formed in the via trenches, a chemical mechanical polishing (CMP) process may be performed to remove excess materials overfilling the via trenches. The through dielectric vias 304 may have various shapes in a top view, such as plate shapes (e.g. circular shapes) or stripe shapes. In some embodiments, the through dielectric vias 304-1 have stripe shapes and the through dielectric vias 304-2 has plate shapes.

Figure 1D:
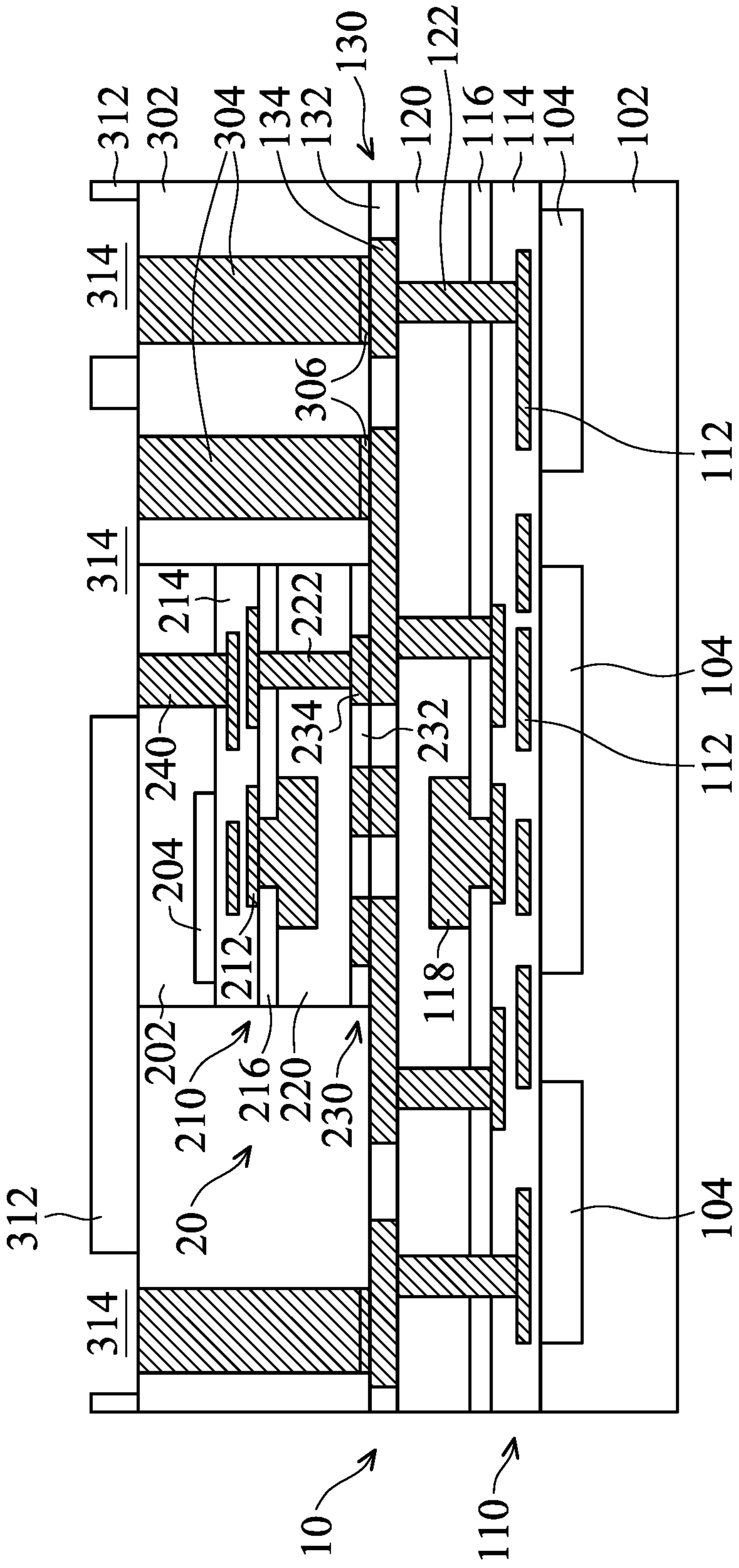

After the through dielectric vias 304 are formed, and an interconnect structure 310 is formed over the dielectric layer 302 in accordance with some embodiments. First, a dielectric layer 312 is formed over the dielectric layer 302 and the chip structure 20, and openings 314 are formed in the dielectric layer 312, as shown in FIG. 1D in accordance with some embodiments. In some embodiments, the dielectric layer 312 is made of a low k dielectric material having a k value lower than 7. In some embodiments, the dielectric layer 312 is made of $SiO_2$, SiN, SiCN, SiOC, SiOCN, or the like. The dielectric layer 312 may be formed by chemical vapor deposition (CVD), physical vapor deposition, (PVD), atomic layer deposition (ALD), or other applicable processes.

Figure 1E:
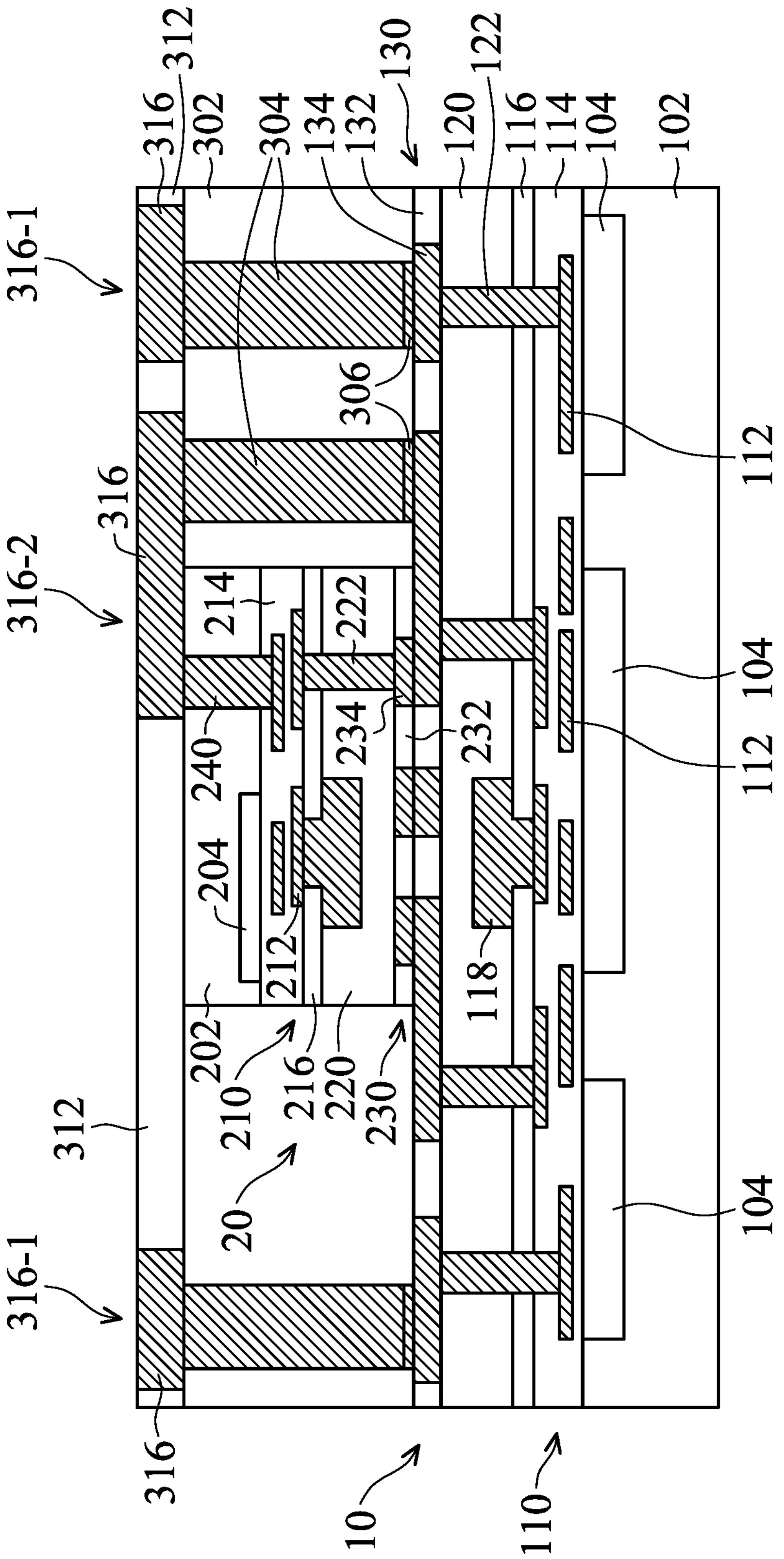

Next, interconnect conductive structures 316 are formed in the openings 314, as shown in FIG. 1E in accordance with some embodiments. In some embodiments, the interconnect conductive structures 316 includes interconnect conductive structures 316-1 directly connected to the through dielectric vias 304-1 (e.g. connected to the ground voltage) and interconnect conductive structures 316-2 directly connected to the through substrate via 240 (e.g. connected to the power voltage). In some embodiments, the interconnect conductive structures 316 are made of a conductive material such as W, Ru, Co, Cu, Ti, TiN, Ta, TaN, Mo, Ni, other applicable conductive materials, or a combination thereof. The conductive material may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In addition, a polishing process, such as CMP process, may be performed after the conductive material is formed. Furthermore, seed layers (not shown) may also be formed over the openings 314 before the interconnect conductive structures 316 are formed. The seed layers may be made of titanium (Ti), cobalt (Co), copper (Cu), TiCu, or the like.

Figure 1F:
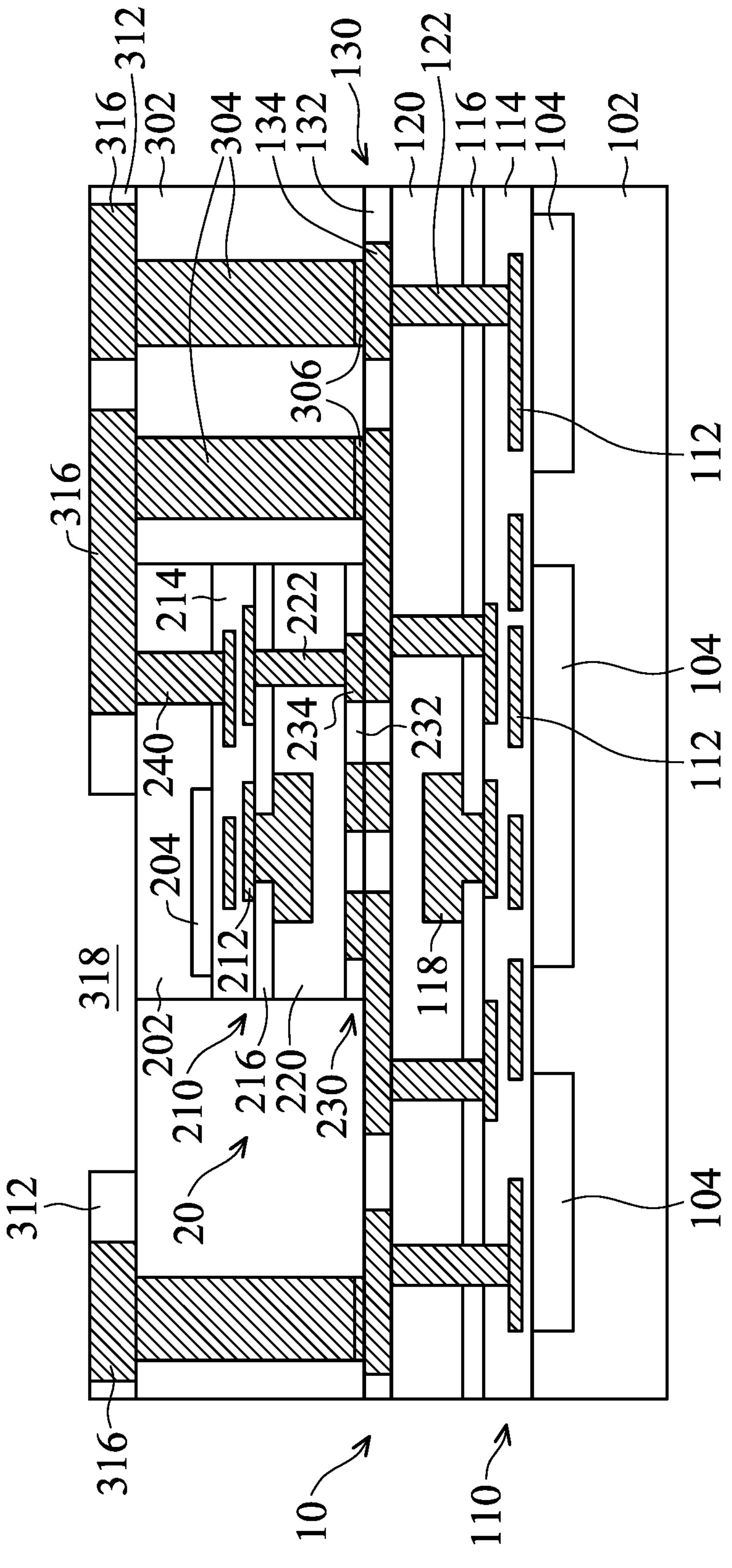

After the interconnect conductive structures 316 are formed, an opening 318 is formed in the dielectric layer 312, as shown in FIG. 1F in accordance with some embodiments. More specifically, the dielectric layer 312 is patterned to form the opening 318 in accordance with some embodiments. In some embodiments, the top surface of the chip structure 20 is partially exposed by the opening 318.

Figure 1G:
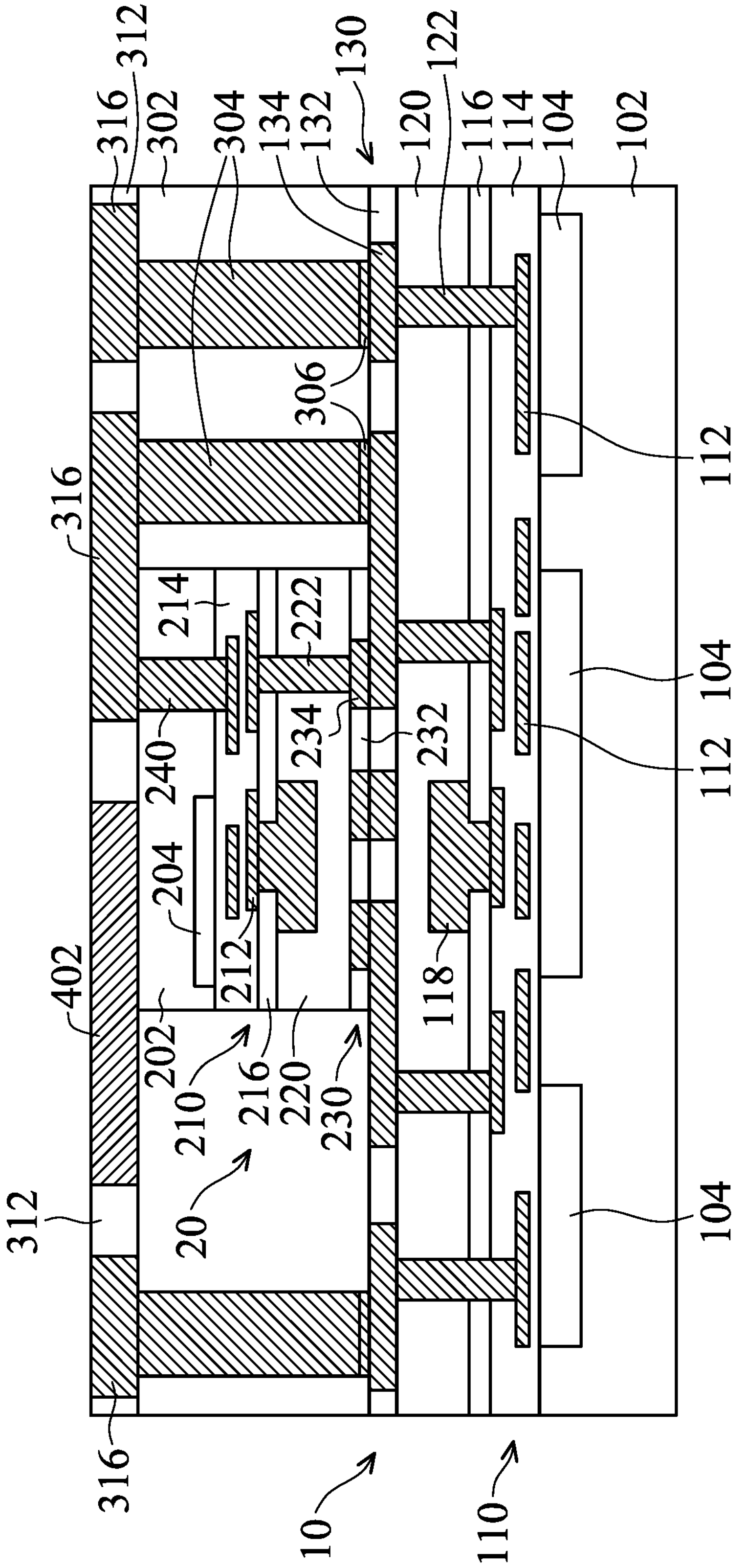

Afterwards, a magnetic portion 402 is formed in the opening 318, as shown in FIG. 1G in accordance with some embodiments. In some embodiments, the magnetic portion 402 is in direct contact with the top surface of the chip structure 20. In some embodiments, the magnetic portion 402 is made of a magnetic material (e.g. materials with high magnetic permeability). In some embodiments, the magnetic portion 402 is made of a material including iron, nickel, cobalt, or their alloys. In some embodiments, the magnetic portion 402 is made of a material including nickel-zinc-copper-iron oxide alloy, yttrium-bismuth-iron oxide alloy, nickel-iron alloy, cobalt-tantalum-zirconium alloy. In some embodiments, the magnetic portion 402 is formed by performing a spin coating process to form 40% Ni-40% Zn-20% Cu—$Fe_2O_4$ alloy or 80% Y-20% Bi—$Fe_5O_{12}$ alloy. In some embodiments, the magnetic portion 402 is formed by performing an electroplating deposition process to form Ni-20% Fe alloy. In some embodiments, the magnetic portion 402 is formed by performing a sputtering process to form Ni-20% Fe alloy or Co-4.5% Ta-4% Zr alloy.

After the magnetic material is formed, a CMP process may be performed until the top surface of the dielectric layer 312 is exposed to form the magnetic portion 402 in the dielectric layer 302, as shown in FIG. 1G in accordance with some embodiments. In some embodiments, the top surface of the magnetic portion 402 is substantially level with the top surface of the dielectric layer 312 and the top surface of the interconnect conductive structure 316.

Figure 1H:
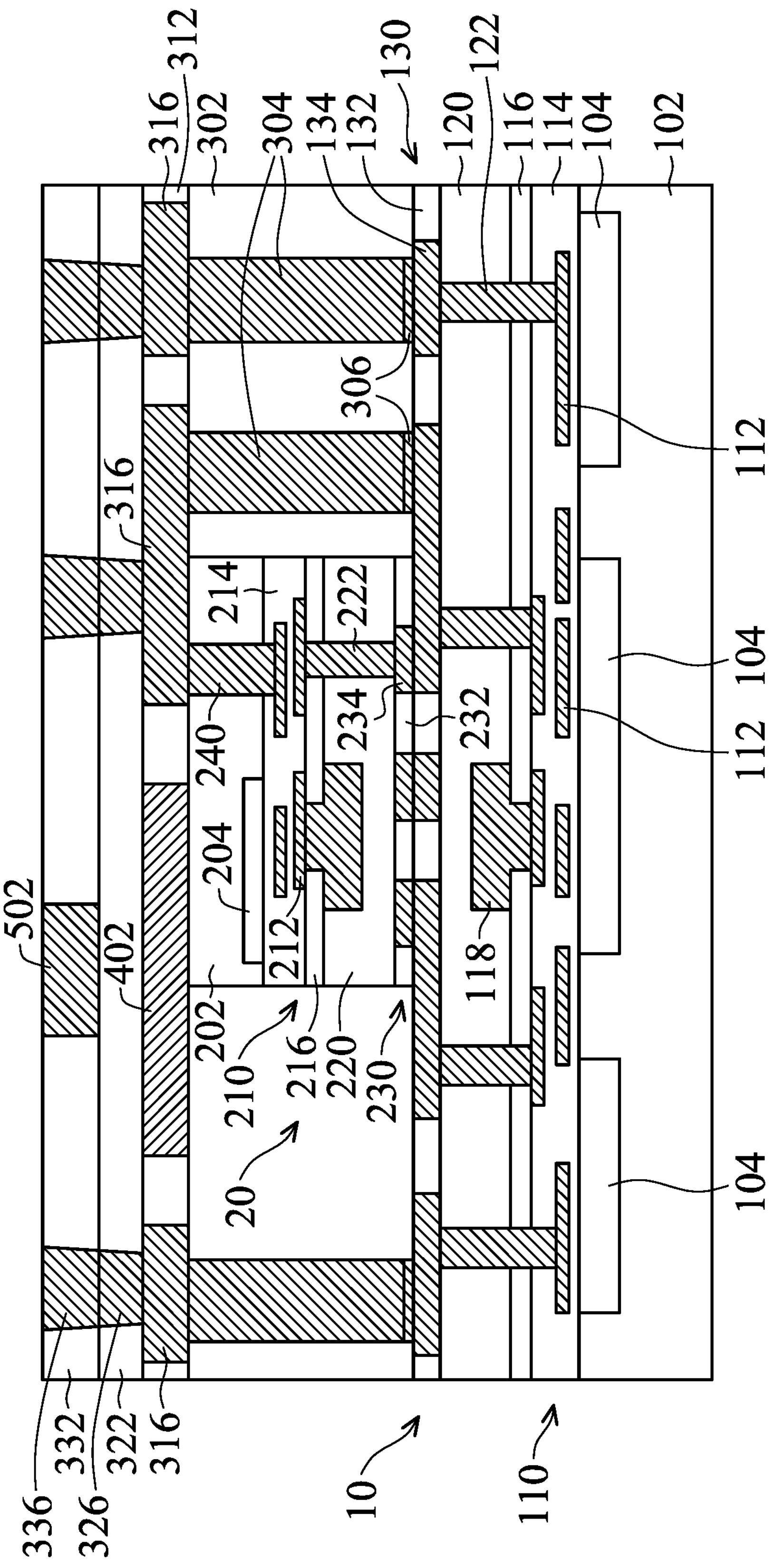

Next, interconnect dielectric layers 322 and 332 are formed over the dielectric layer 312, and interconnect conductive structures 326 and 336 are formed in the interconnect dielectric layers 322 and 332, as shown in FIG. 1H in accordance with some embodiments. The formation of the interconnect dielectric layers 322 and 332 and the interconnect conductive structures 326 and 336 may be similar to, or the same as the formation of the dielectric layer 312 and the interconnect conductive structures 316 described previously and are not repeated herein. In addition, a transmission line 502 is also formed in the interconnect dielectric layer 332 in accordance with some embodiments. The formation of the transmission line 502 may be similar to, or the same as, that of the interconnect conductive structures 326 and 336. In some embodiments, the transmission line 502 and the interconnect conductive structures 326 and 336 are made of the same material and are formed in the same processes. In some embodiments, the transmission line 502 connects at least two chip structures 20 formed in the package structure 100.

Figure 1I:
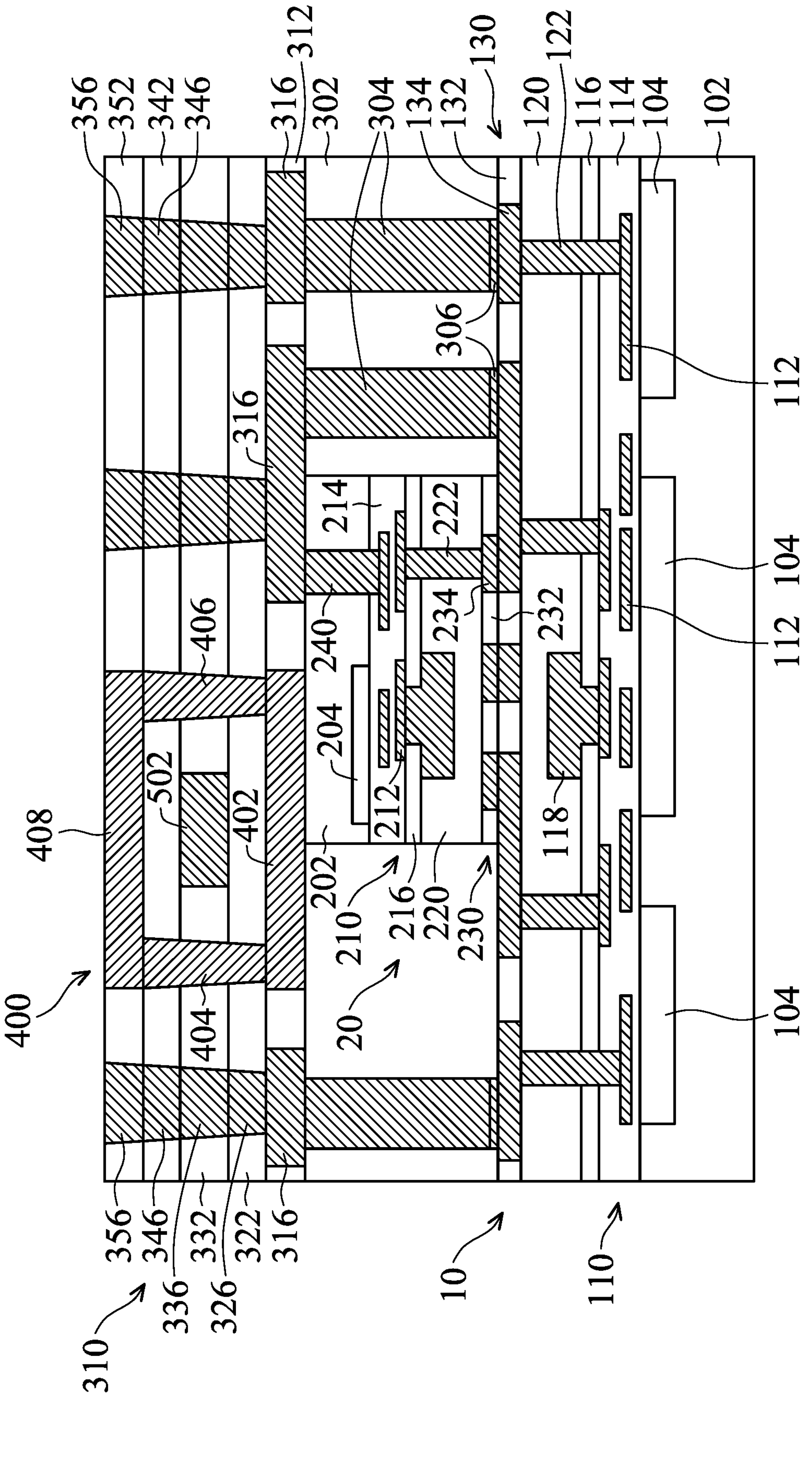

Afterwards, interconnect dielectric layers 342 and 352 are formed over the interconnect dielectric layer 332, and interconnect conductive structures 346 and 356 are formed in the interconnect dielectric layers 342 and 352, as shown in FIG. 1I in accordance with some embodiments. The interconnect dielectric layers 312, 322, 332, 342, and 352 with the interconnect conductive structure 316, 326, 336, 346, and 356 may be seen as the interconnect structure 310. In addition, magnetic portions 404, 406, and 408 are formed in the interconnect dielectric layers 322, 332, 342, and 352 of the interconnect structure 310 in accordance with some embodiments. The magnetic portions 402, 404, 406, and 408 may be seen as a magnetic structure 400 surrounding the transmission line 502. The magnetic structure 400 is configured to shelter the transmission line so the impedance of the transmission line 502 may be improved.

More specifically, the interconnect dielectric layer 342 may be formed over the interconnect dielectric layer 332, the interconnect conductive structures 336, and the transmission line 502, and the interconnect conductive structures 336 may be formed in the interconnect dielectric layer 332. Afterwards, magnetic via trenches may be formed through the interconnect dielectric layers 342, 332, and 322 to expose portions of the magnetic portion 402. Next, magnetic portions 404 and 406 may be formed in the magnetic via trenches. After the magnetic portions 404 and 406 are formed, the interconnect dielectric layer 352 may be formed over the interconnect dielectric layer 342, the interconnect conductive structures 346, and the magnetic portions 404 and 406, and then the interconnect conductive structures 356 may be formed in the interconnect dielectric layer 352. After the interconnect conductive structures 356 are formed, a magnetic via trench may be formed in the interconnect dielectric layer 352 to expose the top surfaces of the magnetic portions 404 and 406, and a magnetic portion 408 may be formed in the magnetic via trench in the interconnect dielectric layer 352. The formation of the interconnect dielectric layers 342 and 352, the interconnect conductive structures 346 and 356, and the magnetic portions 404, 406, and 408 may be similar to, or the same as the formation of the dielectric layer 312, the interconnect conductive structures 316, and the magnetic portion 402 described previously and are not repeated herein. It is appreciated that the sequences for forming the elements described above are merely examples and are not intended to be limiting. For example, the magnetic portions 404 and 406 may be formed with the magnetic portion 408 after the interconnect dielectric layer 352 and the interconnect conductive structures 356 are formed.

Figure 1J:
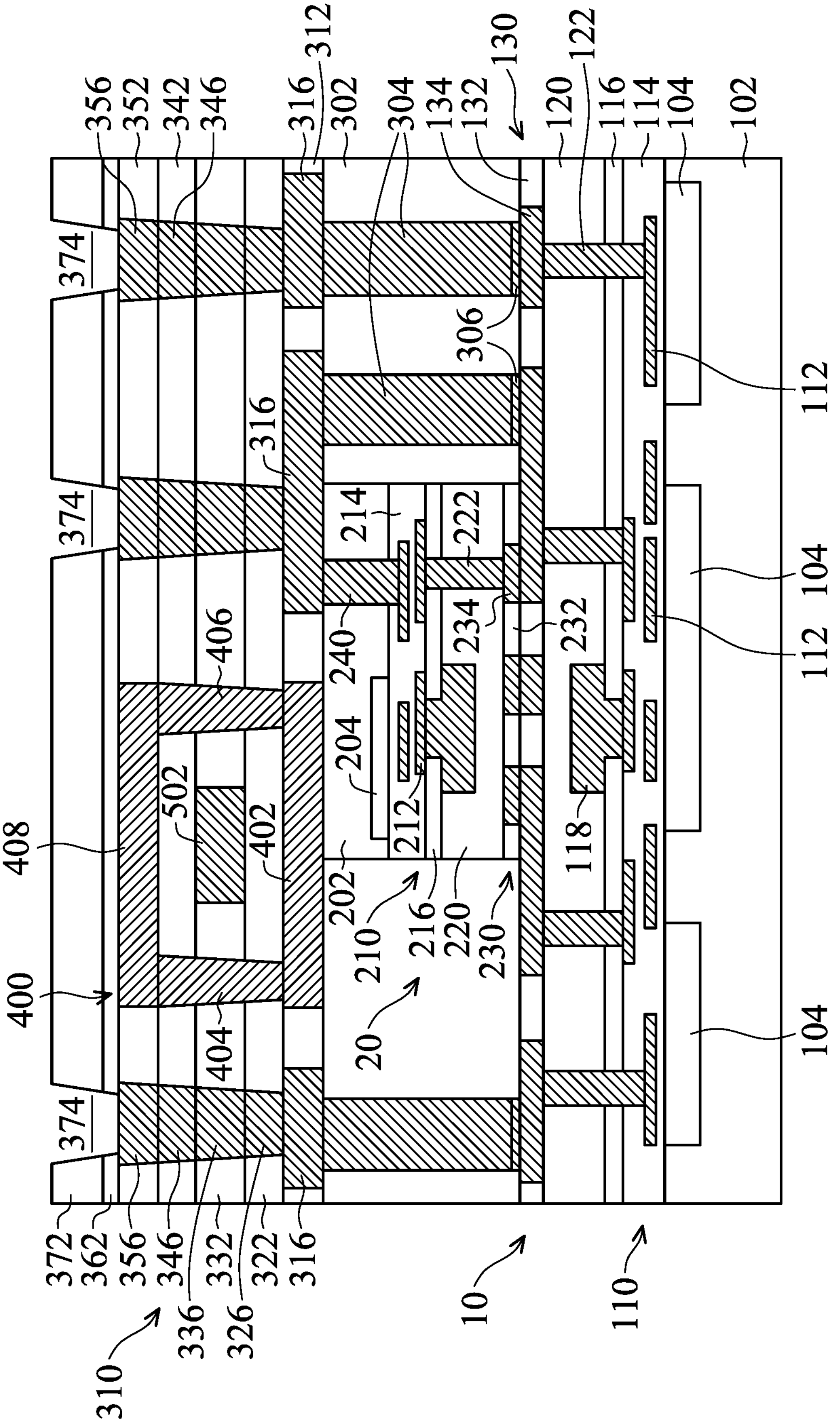

After the magnetic structure 400 is formed, a dielectric layer 362 is formed over the interconnect structure 310, and a protective layer 372 is formed over the dielectric layer 362, as shown in FIG. 1J in accordance with some embodiments. In some embodiments, the dielectric layer 362 is made of a nitride material, such as silicon nitride ($SiN_x$), silicon oxynitride ($SiON_x$), combinations or multiple layers thereof, or the like. In some embodiments, the dielectric layer 362 has a thickness in a range of about 200 nm to about 800 nm. In some embodiments, the protective layer 372 is made of polyimide, polybenzoxazole (PBO), benzocyclobutene (BCB), other suitable polymeric materials, or combinations thereof. In some embodiments, the protective layer 372 has a thickness in a range of about 2.5 μm to about 5 μm.

Afterwards, openings 374 are formed through the dielectric layer 362 and the protective layer 372 to expose the interconnect conductive structures 356, as shown in FIG. 1J in accordance with some embodiments. The openings 374 may be formed by forming a photoresist structure with openings exposing the portions of the dielectric layer 362 and the protective layer 372 that are to be removed. Afterwards, the exposed portions of the dielectric layer 362 and the protective layer 372 may be removed by suitable etching processes.

Figure 1K:
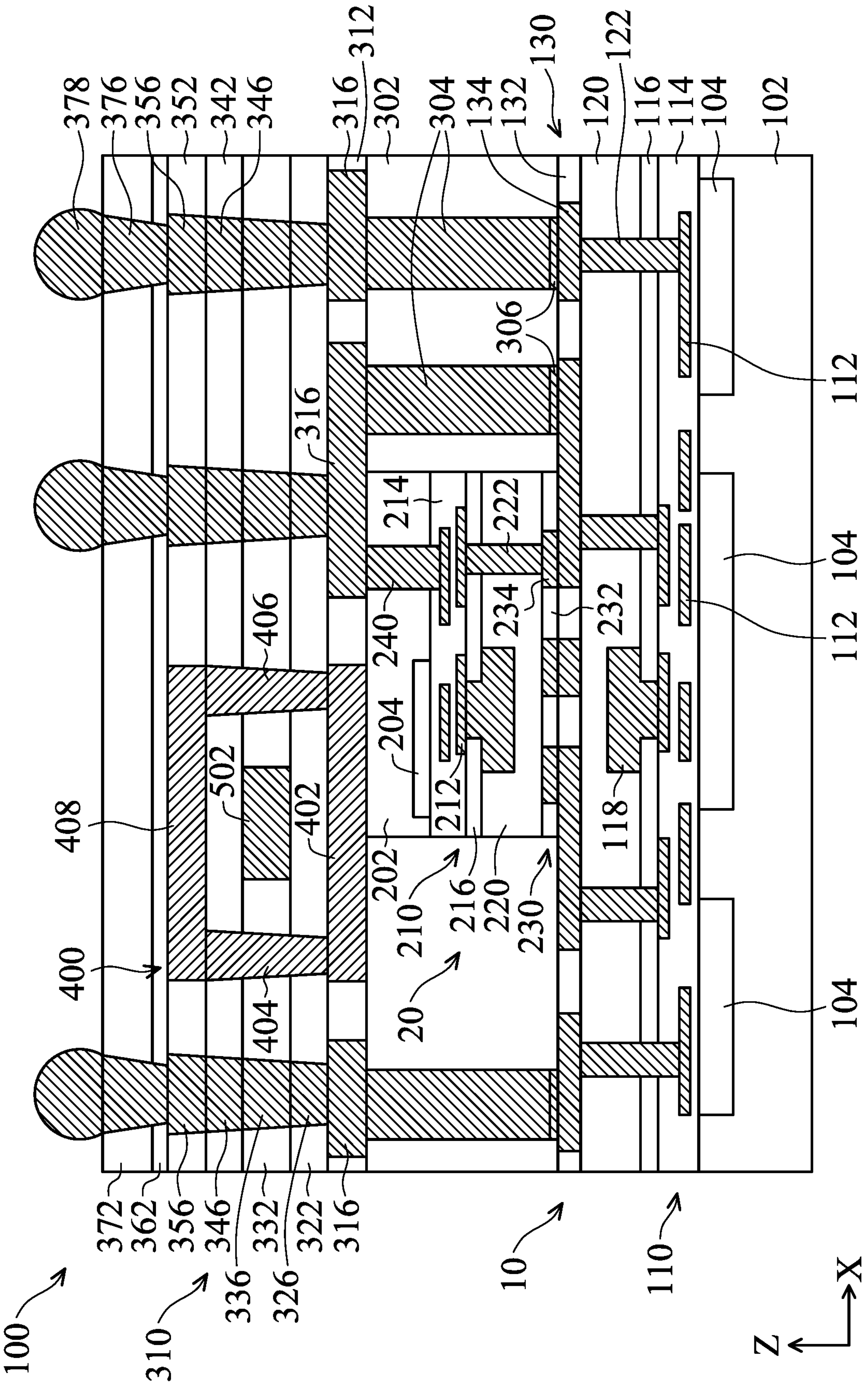

After the openings 374 are formed, conductive structures 376 are formed in the openings 374, and conductive bumps 378 are formed over the conductive structures 376 to form the package structure 100, as shown in FIG. 1K in accordance with some embodiments. The conductive structures 376 may further include protruding portions protruding from the top surface of the protective layer 372 (not shown). The protruding portions of the conductive structures 376 may serve as bonding pads, so that the conductive bumps 378 may be formed over them afterwards. In some embodiments, the conductive bumps 378 are made of a solder material, such as Sn and Ag or another applicable conductive material (e.g., gold). The conductive bumps 378 may be micro bumps, electroless nickel-electroless palladium-immersion gold technique (ENEPIG) formed bumps, ball grid array (BGA) bumps, or the like.

Figures 1, 1K:
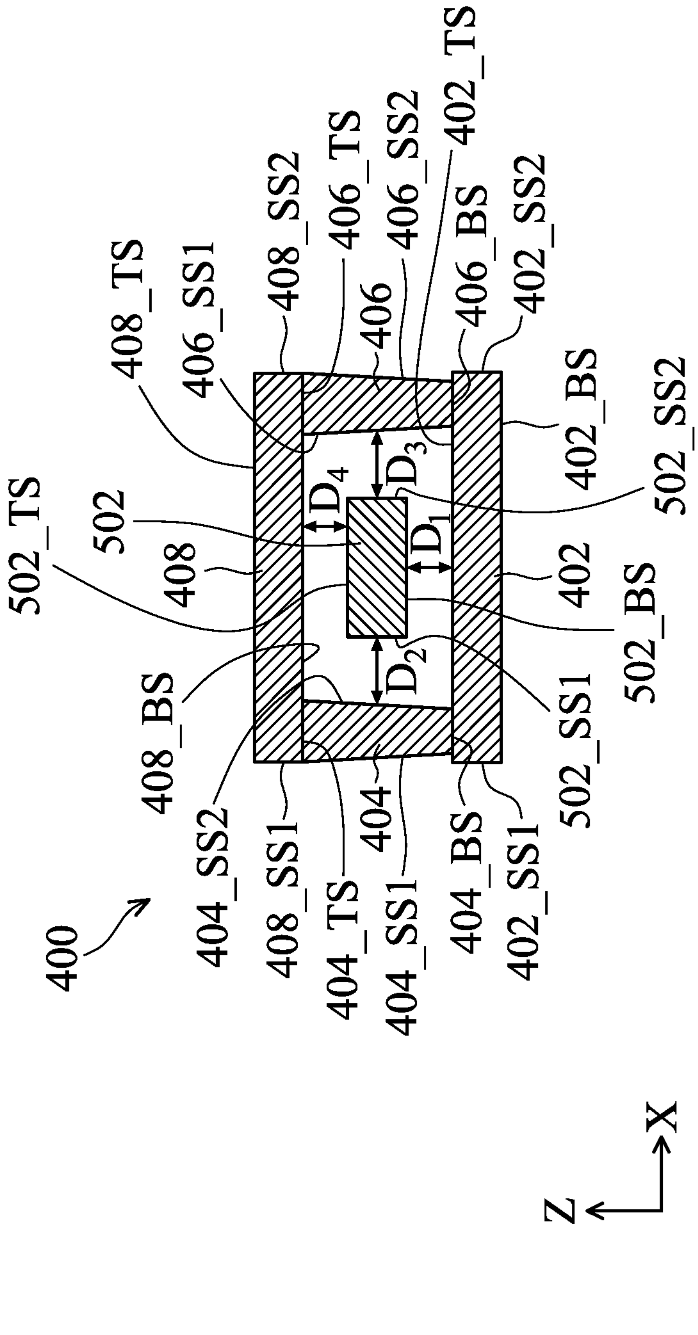

FIG. 1K-1 illustrates an enlarged cross-sectional view of the magnetic structure 400 and the transmission line 502 of the package structure 100 in accordance with some embodiments. FIG. 1K-1 has been simplified for the sake of clarity to better understand the inventive concepts of the present disclosure. As described previously, the magnetic structure 400 includes the magnetic portions 402, 404, 406, and 408 surrounding the transmission line 502 in accordance with some embodiments. In addition, the magnetic structure 400 are separated from the transmission line 502 by the interconnect dielectric layers 322, 332, and 342 in accordance with some embodiments.

As shown in FIG. 1K-1, the transmission line 502 may include a top surface 502_TS, a bottom surface 502_BS, a sidewall surface 502_SS1, and a sidewall surface 502_SS2. In addition, the magnetic portion 402 may include a top surface 402_TS, a bottom surface 402_BS, a sidewall surface 402_SS1, and a sidewall surface 402_SS2. The magnetic portion 404 may include a top surface 404_TS, a bottom surface 404_BS, a sidewall surface 404_SS1, and a sidewall surface 404_SS2. The magnetic portion 406 may include a top surface 406_TS, a bottom surface 406_BS, a sidewall surface 406_SS1, and a sidewall surface 406_SS2. The magnetic portion 408 may include a top surface 408_TS, a bottom surface 408_BS, a sidewall surface 408_SS1, and a sidewall surface 408_SS2. The sidewall surfaces 404_SS2 and 406_SS1, the bottom surface 408_BS, and the top surface 402_TS are arranged facing the sidewall surfaces 502_SS1 and 502_SS2, the top surface 502_TS, and the bottom surface 502_BS of the transmission line 502 respectively.

In some embodiments, the bottom surface 502_BS of the transmission line 502 is vertically spaced apart from the top surface 402_TS of the magnetic portion 402 by a distance $D_1$. In some embodiments, the sidewall surface 502_SS1 of the transmission line 502 is laterally spaced apart from the sidewall surface 404_SS2 of the magnetic portion 404 by a distance $D_2$. In some embodiments, the sidewall surface 502_SS2 of the transmission line 502, opposite the sidewall surface 502_SS1, is laterally spaced apart from the sidewall surface 406_SS1 of the magnetic portion 406 by a distance $D_3$. In some embodiments, the top surface 502_TS of the transmission line 502 is vertically spaced apart from the bottom surface 408_BS of the magnetic portion 408 by a distance $D_4$. In some embodiments, distances $D_1$, $D_2$, $D_3$, and $D_4$ are in a range from about 0.1 μm to about 20 μm.

In addition, since the transmission line 502 is surrounded (e.g. encircled) by the magnetic structure 400 without being in direct contact with the magnetic structure 400, the distance between the magnetic portions at opposite sides of the transmission line 502 is greater than the dimension of the transmission line 502. In some embodiments, the distance between the sidewall surface 404_SS2 of the magnetic portion 404 and the sidewall surface 406_SS1 of the magnetic portion 406 is greater than the dimension (e.g. the width) of the transmission line 502 in the X direction, as shown in FIG. 1K-1. Similarly, the distance between the bottom surface 408_BS of the magnetic portion 408 and the top surface 402_TS of the magnetic portion 402 is greater than the dimension (e.g. the height) of the transmission line 502 in the Z direction, as shown in FIG. 1K-1 in accordance with some embodiments.

In some embodiments, the width of the magnetic portions 404 and 406 gradually decreases from the top portions to the bottom portions, as shown in FIG. 1K-1. In some embodiments, the sidewall surface 404_SS1 of the magnetic portion 404 has a top edge in contact with the magnetic portion 408 and a bottom edge in contact with the magnetic portion 402. In some embodiments, the top edge of the sidewall surface 404_SS1 of the magnetic portion 404 is substantially aligned with the sidewall surface 408_SS1 of the magnetic portion 408, while the bottom edge of the sidewall surface 404_SS1 of the magnetic portion 404 is indented from the sidewall surface 402_SS1 of the magnetic portion 402.

Similarly, the sidewall surface 406_SS2 of the magnetic portion 406 has a top edge in contact with the magnetic portion 408 and a bottom edge in contact with the magnetic portion 402. In some embodiments, the top edge of the sidewall surface 406_SS2 of the magnetic portion 406 is substantially aligned with the sidewall surface 408_SS2 of the magnetic portion 408, while the bottom edge of the sidewall surface 406_SS2 of the magnetic portion 406 is indented from the sidewall surface 402_SS2 of the magnetic portion 402.

As described previously, the magnetic structure 400 is configured to improve the impedance of the transmission line 502. That is, the magnetic structure 400 is formed as a shelter for the transmission line 502, instead of being used for electrical connection. Therefore, the magnetic structure 400 is electrically isolated from the chip structure 20 and the interconnect conductive structures 316, 326, 336, 346, and 356 formed in the interconnect structure 310 in accordance with some embodiments. In some embodiments, the magnetic structure 400 is electrically isolated from any other conductive structures (e.g. through dielectric vias 304) in the package structure 100.

In some embodiments, the magnetic structure 400 is spaced apart from the transmission line 502 by a space that is filled with the interconnect dielectric layers 322, 332, and 342. That is, the interconnect dielectric layer 332 is laterally sandwiched between the magnetic portions 404 and the transmission line 502 and between the magnetic portion 406 and the transmission line 502 in accordance with some embodiments. In some embodiments, the interconnect dielectric layer 322 is vertically sandwiched between the magnetic portions 402 and the transmission line 502, and the interconnect dielectric layer 342 is vertically sandwiched between the magnetic portions 408 and the transmission line 502. In some embodiments, the magnetic structure 400 partially overlaps the chip structure 20 and is in direct contact with the chip structure 20.

Figures 1, 1K, 2:
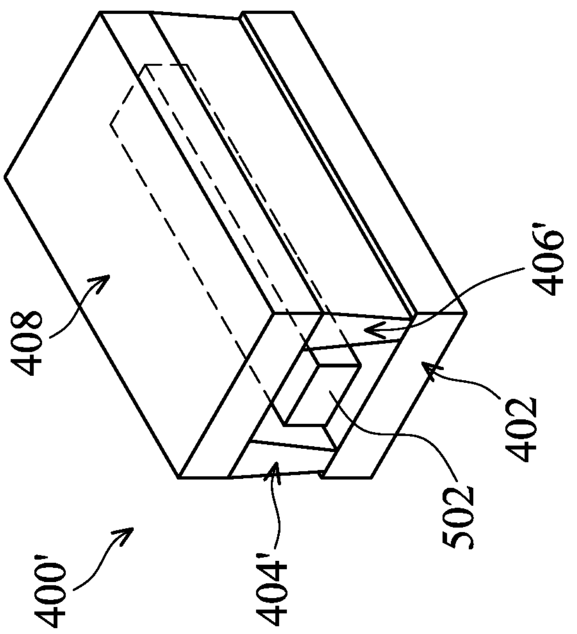
Figures 1, 1K, 2:
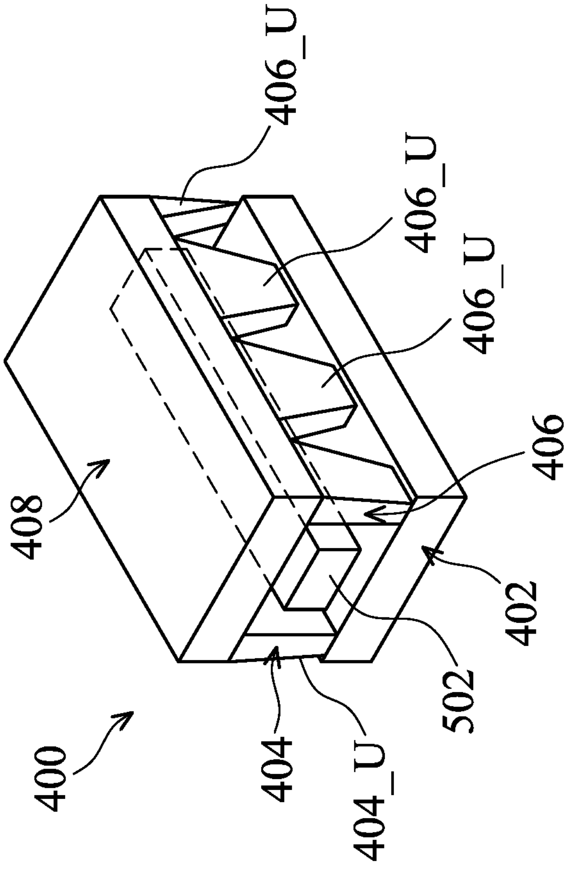
Figures 1, 1K, 2, 3:
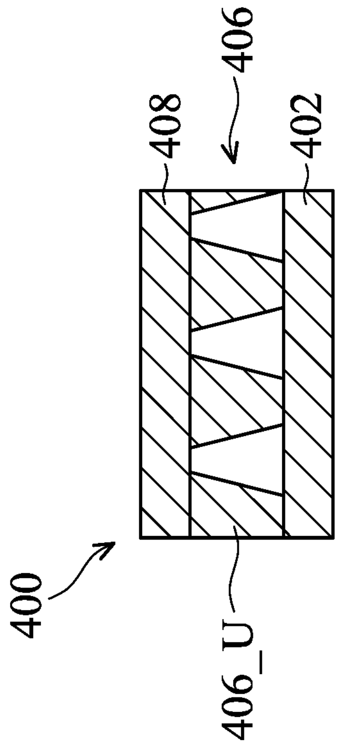

FIG. 1K-2 illustrates a diagrammatic perspective view of the magnetic structure 400 in accordance with some embodiments. FIG. 1K-3 illustrates a cross-sectional view of the magnetic structure 400 shown along Y-Y' in FIG. 1K-2 in accordance with some embodiments. FIGS. 1K-2 and 1K-3 have been simplified for the sake of clarity to better understand the inventive concepts of the present disclosure. As described previously, the magnetic structure 400 includes the magnetic portions 402, 404, 406, and 408 surrounding the transmission line 502, and the magnetic structure 400 is separated from the transmission line 502 by the interconnect dielectric layers 322, 332, and 342 in accordance with some embodiments.

In some embodiments, the transmission line 502 extends along the Y direction to electrically connect two chip structures (not shown). In addition, the magnetic portion 406 includes a number of magnetic units 406_U aligned along the Y direction, and the magnetic portion 404 includes a number of magnetic units 404_U aligned along the Y direction, as shown in FIG. 1K-2 in accordance with some embodiments. The magnetic units 404_U and 406_U may be formed by forming a number of via trenches in the interconnect dielectric layers 322, 332, and 342 along the Y direction and filling the via trenches with a magnetic material. That is, complicated manufacturing processes are not required. In addition, the magnetic structure 400 with the magnetic units 404_U and 406_U forms a firmly stable structure that provides a great reliability.

In addition, the magnetic units 406_U are formed at the same side of the transmission line 502. In some embodiments, the magnetic units 406_U are laterally spaced apart from each other (e.g. in the Y direction). Furthermore, the magnetic units 406_U are in contact with the magnetic portions 402 and 408 in the Z direction. In some embodiments, each of the magnetic units 406_U has a top width and a bottom width, and the top width is greater than the bottom width in the Y direction, as shown in FIG. 1K-3. In some embodiments, the width of each of the magnetic units 406_U gradually decreases in the Z direction.

The magnetic units 404_U are formed at the same side of the transmission line 502 and are formed at opposite sides of the transmission line 502 with the magnetic units 406_U, in accordance with some embodiments. In some embodiments, the magnetic units 404_U are laterally spaced apart from each other (e.g. in the Y direction). In addition, the magnetic units 404_U are in contact with the magnetic portions 402 and 408 in the Z direction. In some embodiments, each of the magnetic units 404_U has a top width and a bottom width, and the top width is greater than the bottom width in the Y direction. In some embodiments, the width of each of the magnetic units 404_U gradually decreases in the Z direction.

FIG. 1K-2' illustrates a diagrammatic perspective view of the magnetic structure 400' in accordance with some embodiments. FIG. 1K-2' has been simplified for the sake of clarity to better understand the inventive concepts of the present disclosure. Similar to the magnetic structure 400, the magnetic structure 400' includes magnetic portions 402, 404', 406', and 408 surrounding the transmission line 502, and the magnetic structure 400' are separated from the transmission line 502 by the interconnect dielectric layers 322, 332, and 342 in accordance with some embodiments.

In some embodiments, the transmission line 502 extends along the Y direction to electrically connect two chip structures (not shown). In addition, the magnetic portions 404 and 406 also continuously extend in the Y direction, as shown in FIG. 1K'-2 in accordance with some embodiments. That is, the transmission line 502 is formed in a space that is substantially encircled by the magnetic structure 400', and therefore it may achieve a higher current and power saving performance. The processes and materials for forming the magnetic structure 400' may be similar to, or the same as, those for forming the magnetic structure 400 and the chip structure 20 described previously and are not repeated herein.

Figure 2A:
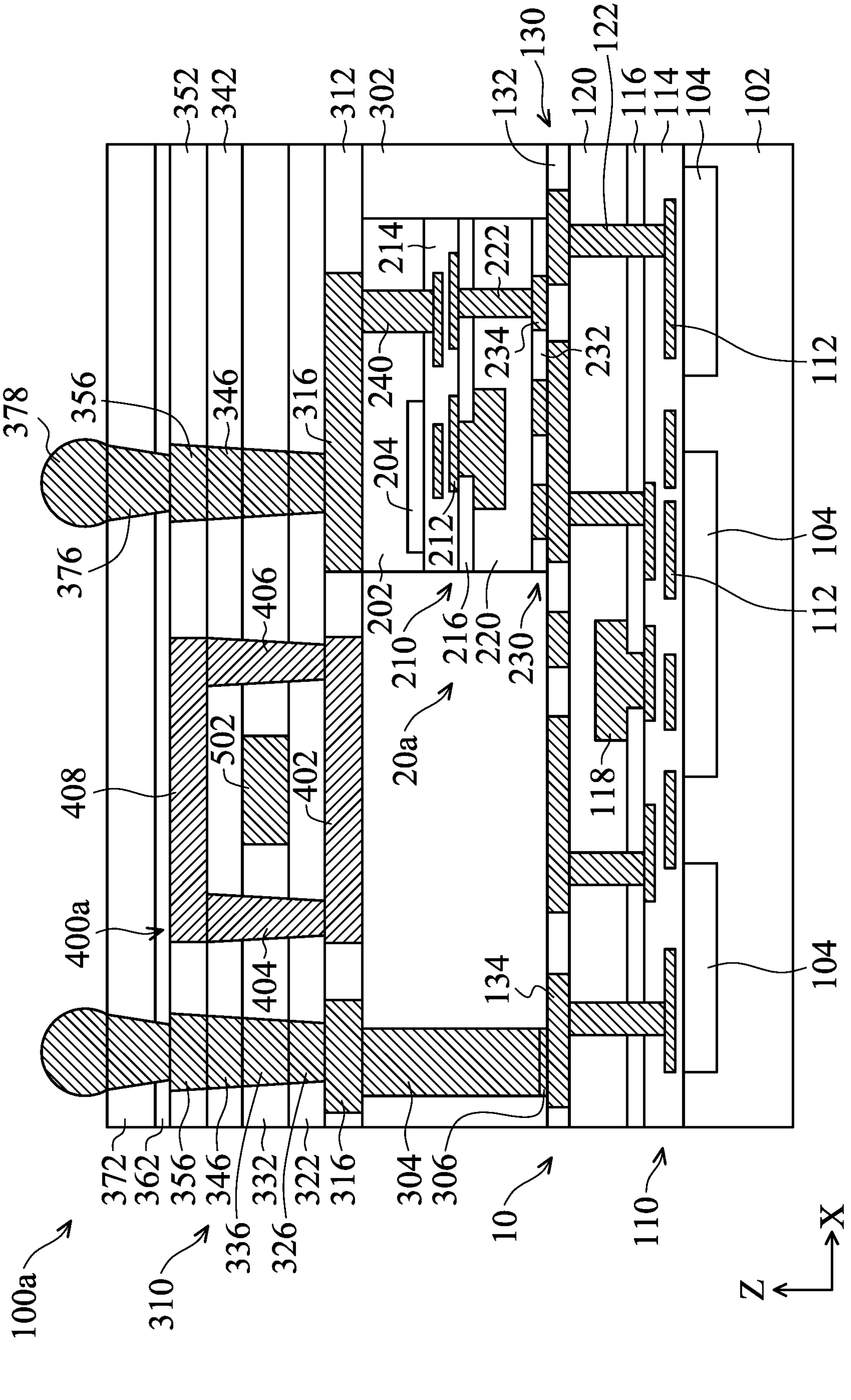
FIG. 2A illustrates a cross-sectional view of a package structure in accordance with some embodiments.

FIG. 2A illustrates a cross-sectional view of a package structure 100*a* in accordance with some embodiments. The package structure 100*a* may be similar to the package structure 100 described previously, except the magnetic structure does not vertically overlaps with the chip structure in accordance with some embodiments. Processes and materials for forming the package structure 100*a* may be similar to, or the same as, those for forming the package structure 100 described previously and are not repeated herein.

More specifically, the package structure 100*a* includes a chip structure 20*a* bonded to the bottom wafer 10 through hybrid bonding and a magnetic structure 400*a* formed around the transmission line 502 and spaced apart from the transmission line 502, as shown in FIG. 2A in accordance with some embodiments. In addition, the magnetic structure 400*a* is formed without vertically overlapping (i.e. in the Z direction) the chip structure 20*a* in accordance with some embodiments. That is, the magnetic structure 400*a* is laterally spaced apart from the chip structure 20*a* (e.g. in both X and Y directions) in accordance with some embodiments.

The processes and materials for forming the magnetic structure 400*a* and the chip structure 20*a* may be similar to, or the same as, those for forming the magnetic structure 400 and the chip structure 20 described previously and are not repeated herein. In addition, the magnetic structure 400*a* may have the structures shown in FIG. 1K-2 or 1K-2' described previously.

Figure 2B:
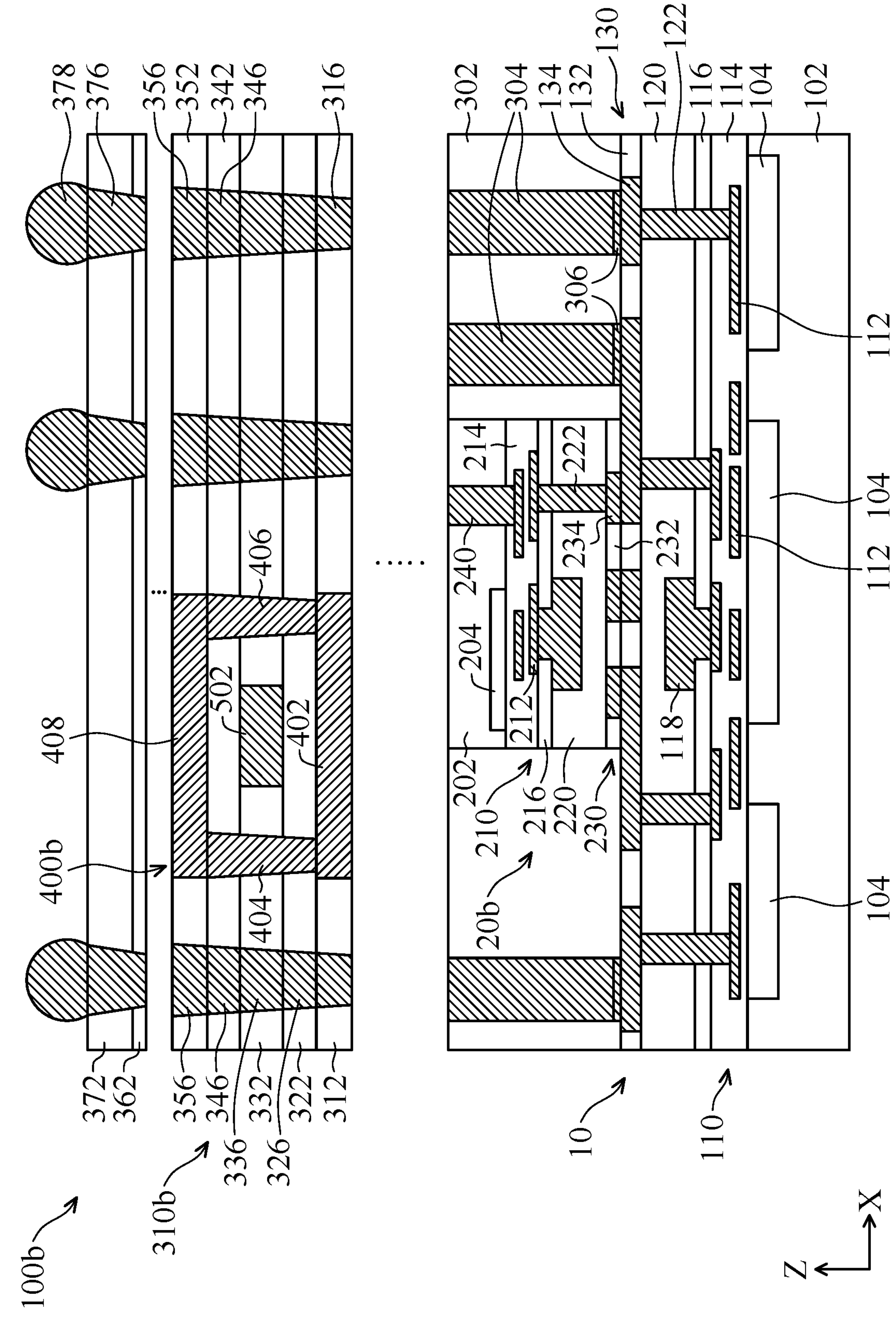
FIG. 2B illustrates a cross-sectional view of a package structure in accordance with some embodiments.

FIG. 2B illustrates a cross-sectional view of a package structure 100*b* in accordance with some embodiments. The semiconductor structure 100*b* may be similar to the semiconductor structure 100 described previously, except the magnetic structure is vertically spaced apart from the chip structure in accordance with some embodiments. Processes and materials for forming the semiconductor structure 100*b* may be similar to, or the same as, those for forming the semiconductor structure 100 described previously and are not repeated herein.

More specifically, the package structure 100*b* includes a chip structure 20*b* bonded to the bottom wafer 10 through hybrid bonding and a magnetic structure 400*b* formed around the transmission line 502 and spaced apart from the transmission line 502, as shown in FIG. 2B in accordance with some embodiments. In addition, the magnetic structure 400*b* is embedded inside an interconnect structure 310*b*. The interconnect structure 310*b* may include a number of interconnect dielectric layers below the interconnect dielectric layer 312 and/or above the interconnect dielectric layer 352 with interconnect conductive structures formed therein. Accordingly, the magnetic structure 400*b* vertically (i.e. in the Z direction) overlaps the chip structure 20*b* but is vertically (i.e. in the Z direction) spaced apart from the chip structure 20*b* in accordance with some embodiments.

The processes and materials for forming the magnetic structure 400*b*, the chip structure 20*b*, and the interconnect structure 310*b* may be similar to, or the same as, those for forming the magnetic structure 400, the chip structure 20, and the interconnect structure 310 described previously and are not repeated herein. In addition, the magnetic structure 400*b* may have the structures shown in FIG. 1K-2 or 1K-2' described previously.

Figure 2C:
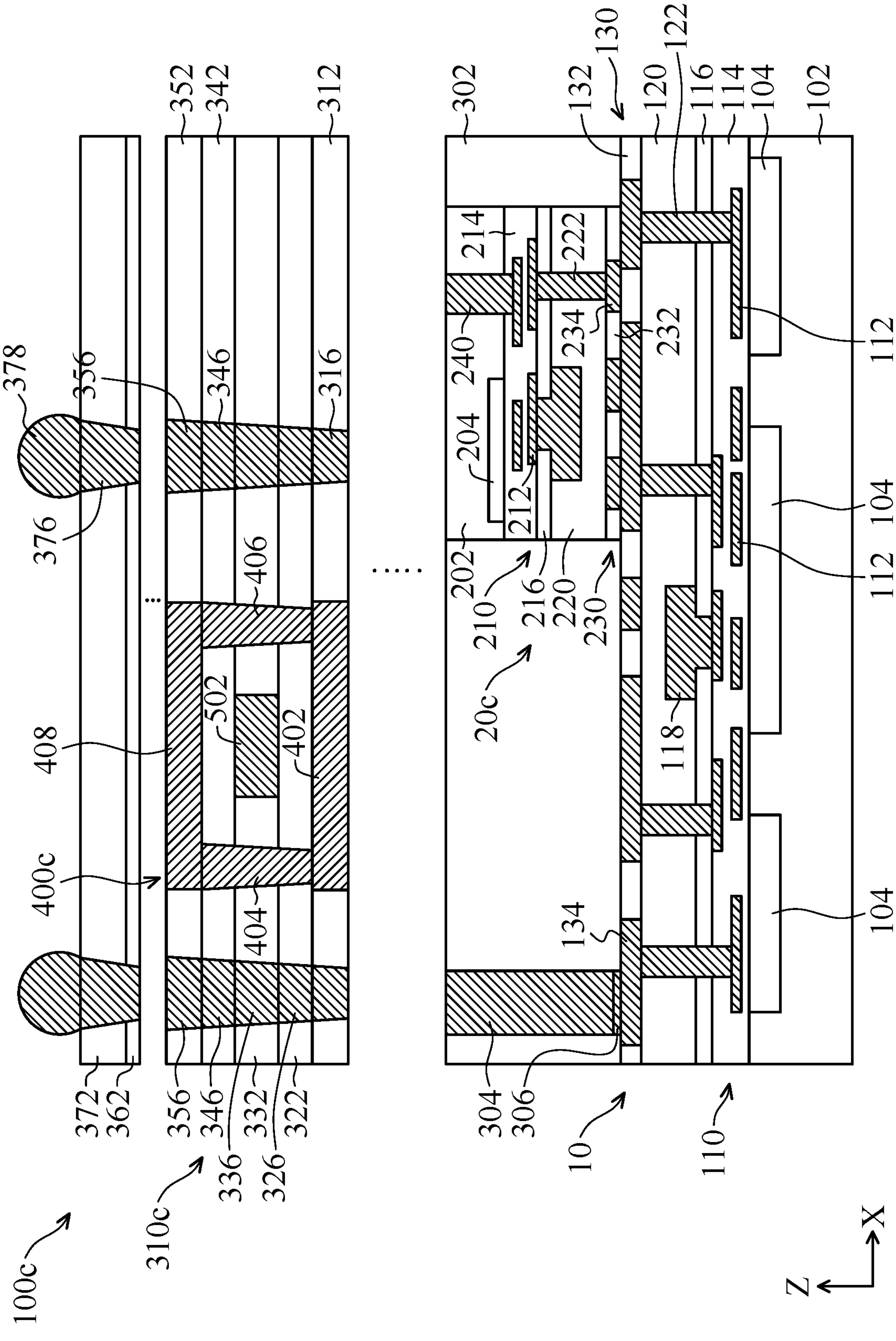
FIG. 2C illustrates a cross-sectional view of a package structure in accordance with some embodiments.

FIG. 2C illustrates a cross-sectional view of a package structure 100*c* in accordance with some embodiments. The semiconductor structure 100*c* may be similar to the semiconductor structure 100*a* described previously, except the magnetic structure is vertically spaced apart from the chip structure in accordance with some embodiments. Processes and materials for forming the semiconductor structure 100*c* may be similar to, or the same as, those for forming the semiconductor structures 100, 100*a*, and 100*b* described previously and are not repeated herein.

More specifically, the package structure 100*c* includes a chip structure 20*c* bonded to the bottom wafer 10 through hybrid bonding and a magnetic structure 400*c* formed around the transmission line 502 and spaced apart from the transmission line 502, as shown in FIG. 2C in accordance with some embodiments. In addition, the magnetic structure 400*c* is embedded inside an interconnect structure 300*c*. The interconnect structure 310*c* may include a number of interconnect dielectric layers below the interconnect dielectric layer 312 and/or above the interconnect dielectric layer 352 with interconnect conductive structures formed therein. Accordingly, the magnetic structure 400*c* does not vertically (i.e. in the Z direction) overlap the chip structure 20*c* and is vertically (i.e. in the Z direction) spaced apart from the chip structure 20*c* in accordance with some embodiments.

The processes and materials for forming the magnetic structure 400*c*, the chip structure 20*c*, and the interconnect structure 310*c* may be similar to, or the same as, those for forming the magnetic structure 400, the chip structure 20, and the interconnect structure 310 described previously and are not repeated herein. In addition, the magnetic structure 400*c* may have the structures shown in FIG. 1K-2 or 1K-2' described previously.

Figure 3C:
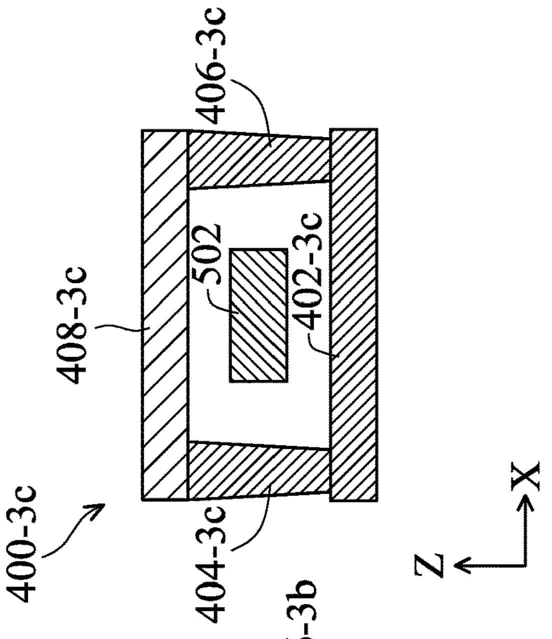
FIGS. 3A to 3C illustrate enlarged cross-sectional views of magnetic structures in accordance with some embodiments.
Figure 3B:
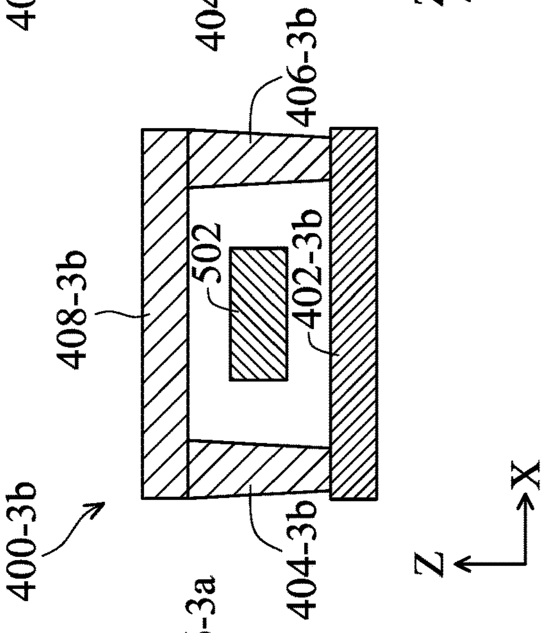
Figure 3A:
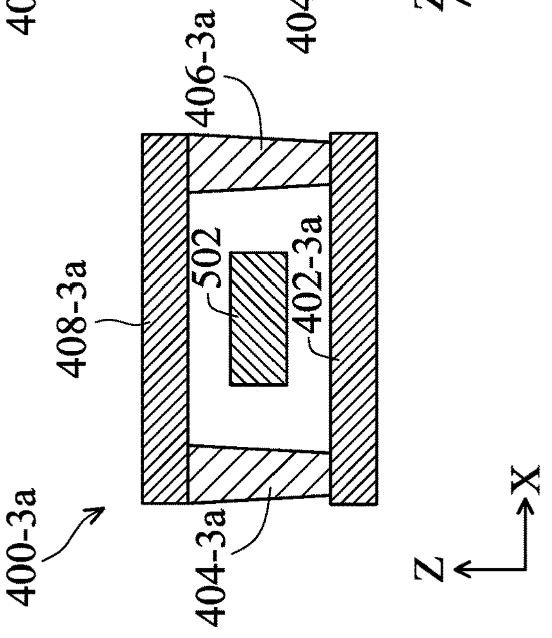

FIGS. 3A to 3C illustrate enlarged cross-sectional views of magnetic structures 400-3*a*, 400-3*b*, and 400-3*c* in accordance with some embodiments. The magnetic structures 400-3*a*, 400-3*b*, and 400-3*c* may be similar to the magnetic structures 400 or 400' described previously, except materials for forming different portions of the magnetic structures 400-3*a*, 400-3*b*, and 400-3*c* are different in accordance with some embodiments. Processes and materials for forming the magnetic structures 400-3*a*, 400-3*b*, and 400-3*c* may be similar to, or the same as, those for forming the magnetic structure 400 described previously and are not repeated herein. In addition, the magnetic structures 400-3*a*, 400-3*b*, and 400-3*c* may be applied to the package structures 100, 100*a*, 100*b*, and 100*c* described previously.

More specifically, the magnetic structure 400-3*a* includes magnetic portions 402-3*a*, 404-3*a*, 406-3*a*, and 408-3*a* in accordance with some embodiments. In some embodiments, the magnetic portions 402-3*a* and 408-3*a* are made of a first magnetic material, and the magnetic portions 404-3*a* and 406-3*a* are made of a second magnetic material different from the first magnetic material.

The magnetic structure 400-3*b* includes magnetic portions 402-3*b*, 404-3*b*, 406-3*b*, and 408-3*b* in accordance with some embodiments. In some embodiments, the magnetic portion 402-3*b* is made of a first magnetic material, and the magnetic portions 404-3*b*, 406-3*b*, 408-3*b* are made of a second magnetic material different from the first magnetic material.

The magnetic structure 400-3*c* includes magnetic portions 402-3*c*, 404-3*c*, 406-3*c*, and 408-3*c* in accordance with some embodiments. In some embodiments, the magnetic portions 402-3*c*, 404-3*c*, and 406-3*c* are made of a first magnetic material, and the magnetic portion 408-3*c* is made of a second magnetic material different from the first magnetic material.

Figure 4B:
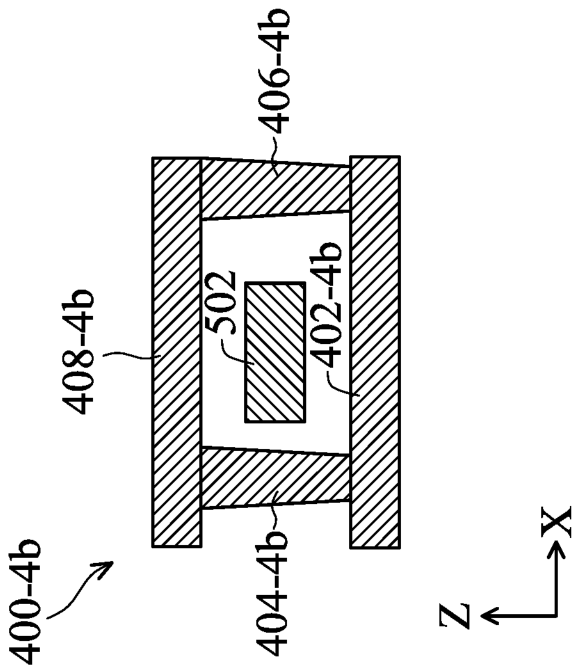
FIGS. 4A and 4B illustrate enlarged cross-sectional views of magnetic structures in accordance with some embodiments.
Figure 4A:
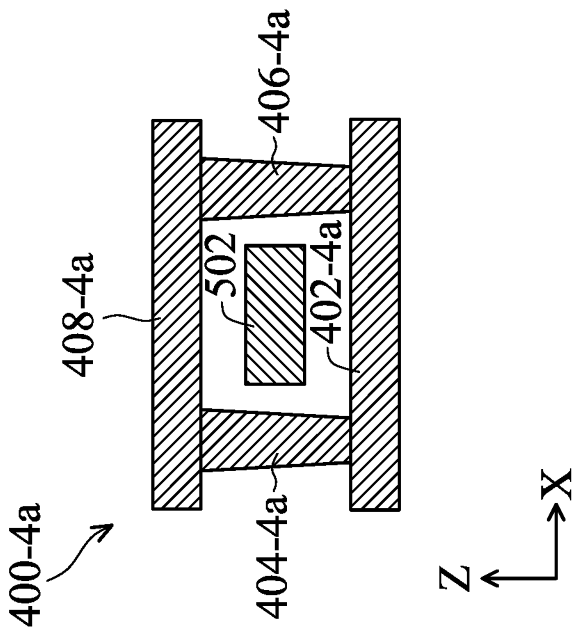
Figure 5A:
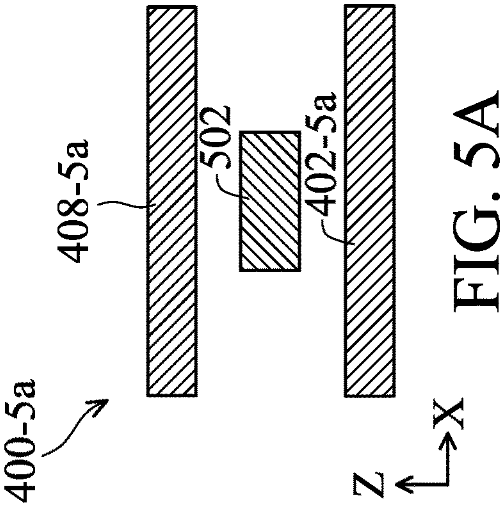
FIGS. 5A to 5G illustrate enlarged cross-sectional views of magnetic structures in accordance with some embodiments.
Figure 5B:
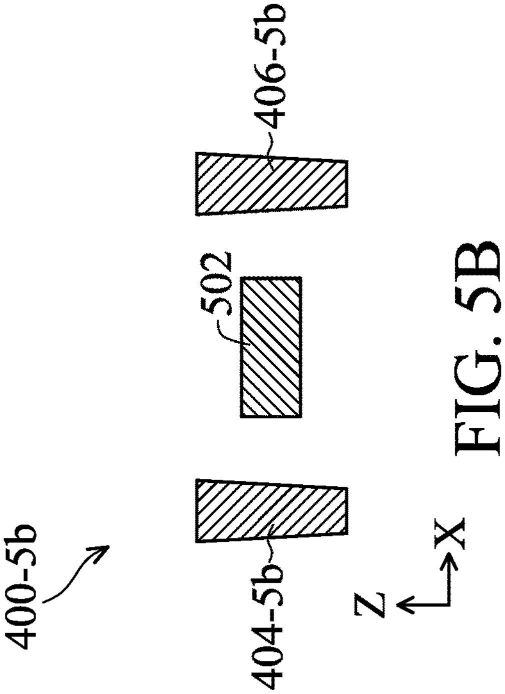
Figure 5C:
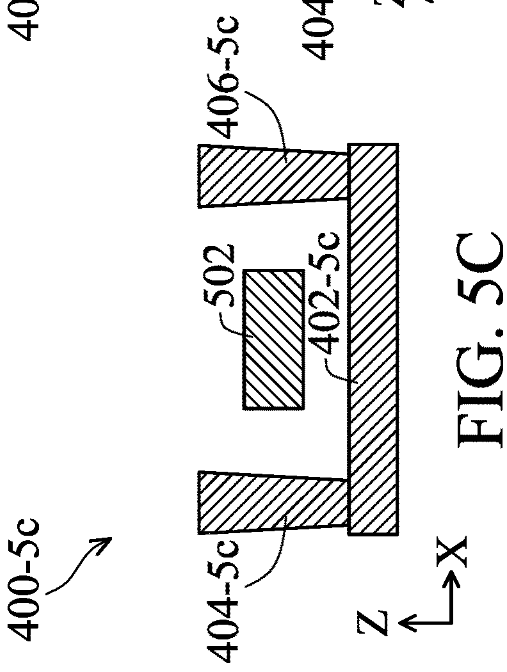
Figure 5D:
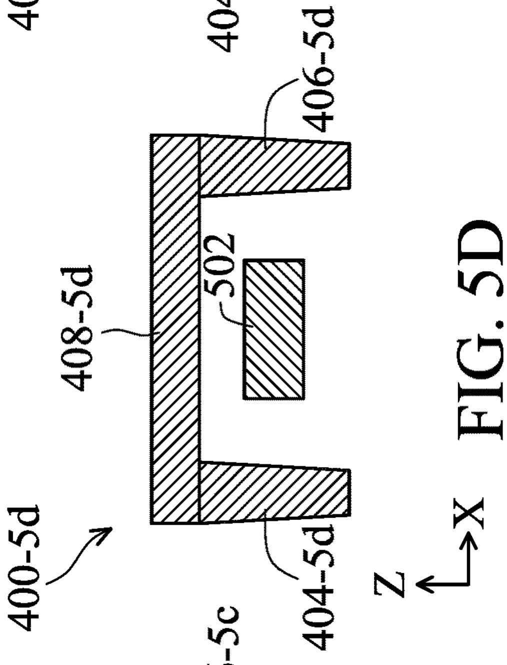
Figure 5E:
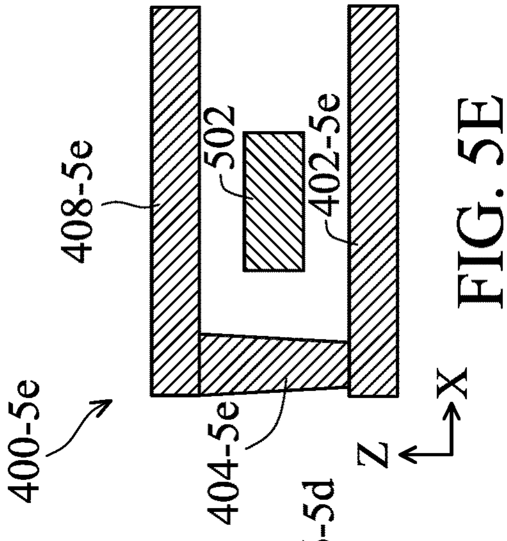
Figure 5F:
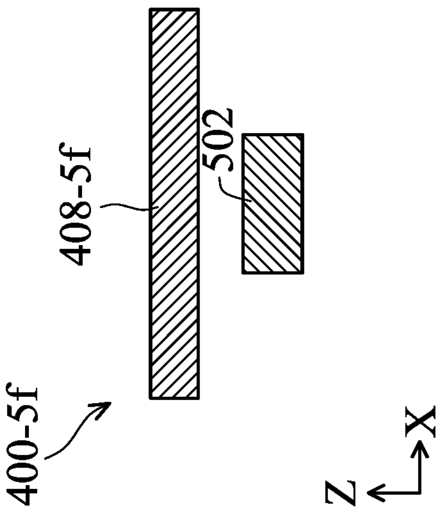
Figure 5G:
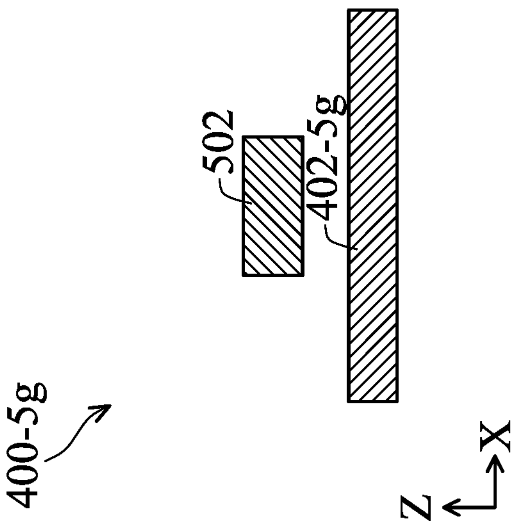

FIGS. 4A and 4B illustrate enlarged cross-sectional views of magnetic structures 400-4*a* and 400-4*b* in accordance with some embodiments. The magnetic structures 400-4*a* and 400-4*b* may be similar to the magnetic structure 400 described previously, except that the spatial relationship of the magnetic portions are different in accordance with some embodiments. Processes and materials for forming the magnetic structures 400-4*a* and 400-4*b* may be similar to, or the same as, those for forming the magnetic structures 400 or 400' described previously and are not repeated herein. In addition, the magnetic structures 400-4*a* and 400-4*b* may be applied to the package structures 100, 100*a*, 100*b*, and 100*c* described previously.

More specifically, the magnetic structure 400-4*a* includes magnetic portions 402-4*a*, 404-4*a*, 406-4*a*, and 408-4*a* in accordance with some embodiments. The magnetic portions 404-4*a* and 406-4*a* are indented from the sidewalls of the magnetic portions 402-4*a* and 408-4*a*, as shown in FIG. 4A in accordance with some embodiments. In some embodiments, the distance between the magnetic portion 404-4*a* and 406-4*a* in the X direction is greater than the width of the transmission line 502 in the X direction but is smaller than the width of the magnetic portion 408-4*a* and the width of the magnetic portion 402-4*a* in the X direction. In some embodiments, the distance between the magnetic portion 404-4*a* and the transmission line 502 is substantially equal to the distance between the magnetic portion 406-4*a* and the transmission line 502. In some embodiments, the magnetic portions 402-4*a*, 404-4*a*, 406-4*a*, and 408-4*a* are made of the same or different magnetic materials, similar to the magnetic structure 400 and 400-3*a* to 400-3*c* described previously.

The magnetic structure 400-4*b* includes magnetic portions 402-4*b*, 404-4*b*, 406-4*b*, and 408-4*b* in accordance with some embodiments. Similar to the magnetic portion 404-4*a* described previously, the magnetic portions 404-4*b* is indented from the sidewalls of the magnetic portions 402-4*b* and 408-4*b*, as shown in FIG. 4B in accordance with some embodiments. On the other hand, the top edge of the sidewall surface of the magnetic portion 406-4*b* is substantially aligned with the sidewall surface of the magnetic portion 408-4*b*, while the bottom edge of the sidewall surface of the magnetic portion 406-4*b* is indented from the sidewall surface of the magnetic portion 402-4*b* in accordance with some embodiments. In some embodiments, the distance between the magnetic portion 404-4*b* and 406-4*b* in the X direction is greater than the width of the transmission line 502 in the X direction but is smaller than the width of the magnetic portion 408-4*b* and the width of the magnetic portion 402-4*b* in the X direction. In some embodiments, the distance between the magnetic portion 404-4*b* and the transmission line 502 is smaller than the distance between the magnetic portion 406-4*b* and the transmission line 502. In some embodiments, the magnetic portions 402-4*b*, 404-4*b*, 406-4*b*, and 408-4*b* are made of the same or different magnetic materials, similar to the magnetic structures 400 and 400-3*a* to 400-3*c* described previously.

FIGS. 5A to 5G illustrate enlarged cross-sectional views of magnetic structures 400-5*a*, 400-5*b*, 400-5*c*, 400-5*d*, 400-5*e*, 400-5*f*, and 400-5*g* in accordance with some embodiments. The magnetic structures 400-5*a*, 400-5*b*, 400-5*c*, 400-5*d*, 400-5*e*, 400-5*f*, and 400-5*g* may be similar to the magnetic structures 400 or 400' described previously, except some of the magnetic portions are omitted in accordance with some embodiments. Processes and materials for forming the magnetic structures 400-5*a*, 400-5*b*, 400-5*c*, 400-5*d*, 400-5*e*, 400-5*f*, and 400-5*g* may be similar to, or the same as, those for forming the magnetic structure 400 described previously and are not repeated herein. In addition, the magnetic structures 400-5*a*, 400-5*b*, 400-5*c*, 400-5*d*, 400-5*e*, 400-5*f*, and 400-5*g* may be applied to the package structures 100, 100*a*, 100*b*, and 100*c* described previously.

More specifically, the magnetic structure 400-5*a* includes magnetic portions 402-5*a* and 408-5*a* in accordance with some embodiments. That is, the magnetic portions 404 and 406 of the magnetic structure 400 are omitted. Since the magnetic portions 402-5*a* and 408-5*a* are formed on opposite sides of the transmission line 502, the energy loss of the transmission line 502 during operation may still be reduced. In addition, the formation of the magnetic portions 402-5*a* and 408-5*a* may be applied to the formation of the interconnect structure 310 without requiring additional complicated manufacturing processes. In some embodiments, the magnetic portions 402-5*a* and 408-5*a* are made of the same magnetic material. In some embodiments, the magnetic portions 402-5*a* and 408-5*a* are made of different magnetic materials.

The magnetic structure 400-5*b* includes magnetic portions 404-5*b* and 406-5*b* in accordance with some embodiments. That is, the magnetic portions 402 and 408 of the magnetic structure 400 are omitted. Since the magnetic portions 404-5*b* and 406-5*b* are formed on opposite sides of the transmission line 502, the energy loss of the transmission line 502 during operation may still be reduced. In some embodiments, the magnetic portions 404-5*b* and 406-5*b* are made of the same magnetic material. In some embodiments, the magnetic portions 404-5*b* and 406-5*b* are made of different magnetic materials.

The magnetic structure 400-5*c* includes magnetic portions 402-5*c*, 404-5*c* and 406-5*c* in accordance with some embodiments. That is, the magnetic portion 408 of the magnetic structure 400 is omitted. As described above, the magnetic portions 402-5*c*, 404-5*c* and 406-5*c* are formed at three sides of the transmission line 502, and therefore the energy loss of the transmission line 502 during operation may be reduced. In some embodiments, the magnetic portions 402-5*c*, 404-5*c* and 406-5*c* are made of the same magnetic material. In some embodiments, the magnetic portions 402-5*c*, 404-5*c* and 406-5*c* are made of different magnetic materials.

The magnetic structure 400-5*d* includes magnetic portions 404-5*d*, 406-5*d*, and 408-5*d* in accordance with some embodiments. That is, the magnetic portion 402 of the magnetic structure 400 is omitted. As described above, the magnetic portions 404-5*d*, 406-5*d*, and 408-5*d* are formed at three sides of the transmission line 502, and therefore the energy loss of the transmission line 502 during operation may be reduced. In some embodiments, the magnetic portions 404-5*d*, 406-5*d*, and 408-5*d* are made of the same magnetic material. In some embodiments, the magnetic portions 404-5*d*, 406-5*d*, and 408-5*d* are made of different magnetic materials.

The magnetic structure 400-5*e* includes magnetic portions 402-5*e*, 404-5*e*, and 408-5*e* in accordance with some embodiments. That is, the magnetic portion 406 of the magnetic structure 400 is omitted. As described above, the magnetic portions 402-5*e*, 404-5*e*, and 408-5*e* are formed at three sides of the transmission line 502, and therefore the energy loss of the transmission line 502 during operation may be reduced. In some embodiments, the magnetic portions 402-5*e*, 404-5*e*, and 408-5*e* are made of the same magnetic material. In some embodiments, the magnetic portions 402-5*e*, 404-5*e*, and 408-5*e* are made of different magnetic materials.

The magnetic structure 400-5*f* includes a magnetic portion 408-5*f* in accordance with some embodiments. That is, the magnetic portions 402, 404 and 406 of the magnetic structure 400 are omitted. Since the magnetic portion 408-5*f* is formed adjacent to the transmission line 502, the energy loss of the transmission line 502 during operation may still be reduced. In addition, the formation of the magnetic portion 400-5*f* may be applied to the formation of the interconnect structure 310 without requiring additional complicated manufacturing processes.

The magnetic structure 400-5*g* includes a magnetic portion 405-5*g* in accordance with some embodiments. That is, the magnetic portions 404, 406 and 408 of the magnetic structure 400 are omitted. Since the magnetic portion 402-5*g* is formed adjacent to the transmission line 502, the energy loss of the transmission line 502 during operation may still be reduced. In addition, the formation of the magnetic portion 400-5*g* may be applied to the formation of the interconnect structure 310 without requiring additional complicated manufacturing processes.

Figure 6:
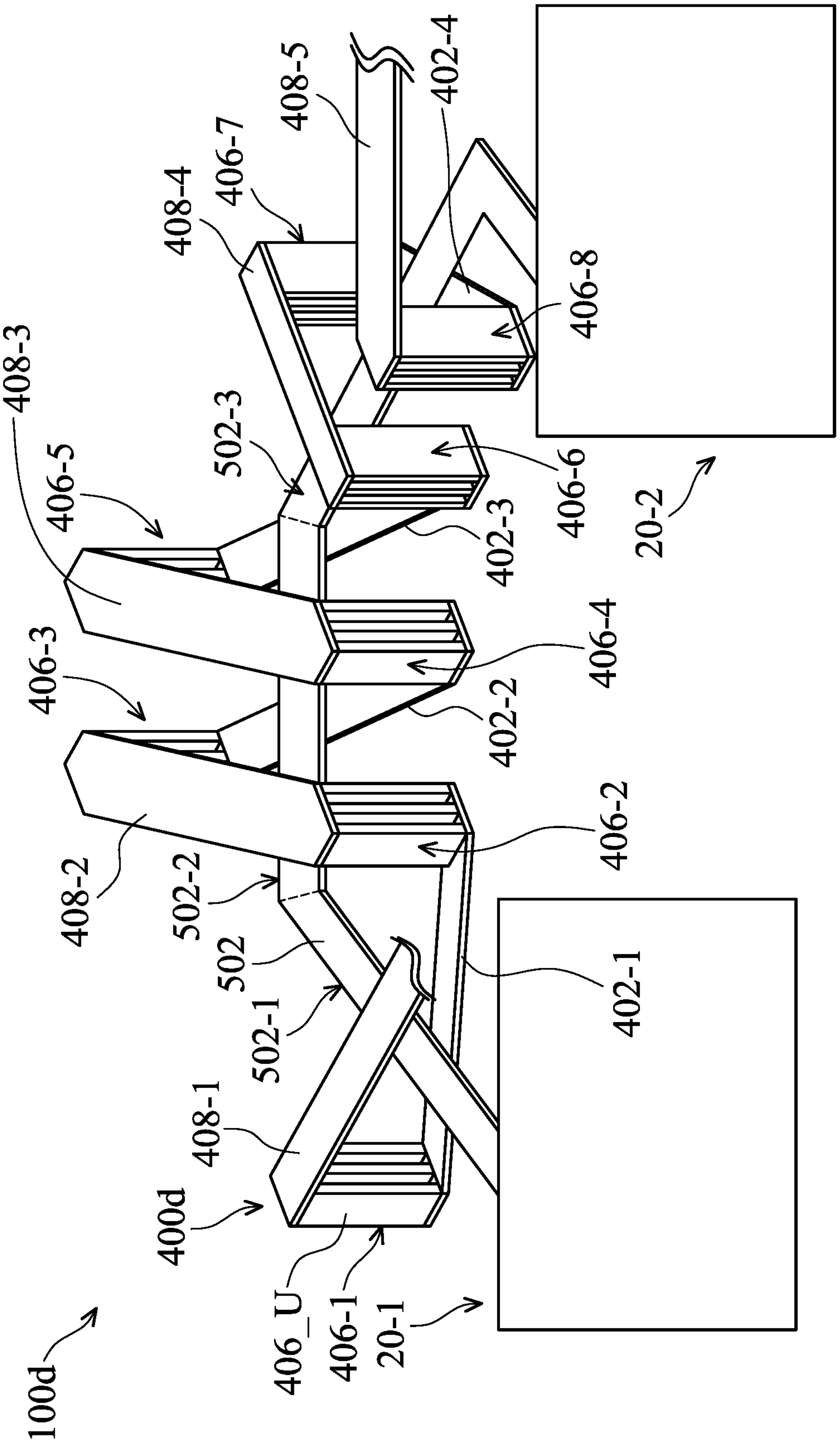
FIG. 6 illustrates a diagrammatic perspective view of a package structure in accordance with some embodiments.

FIG. 6 illustrates a diagrammatic perspective view of a package structure 100*d* in accordance with some embodiments. FIG. 6 has been simplified for the sake of clarity to better understand the inventive concepts of the present disclosure. The semiconductor structure 100*d* may be similar to the semiconductor structure 100 described previously, except the magnetic structure forms a coil shape around the transmission line 502 in accordance with some embodiments. Processes and materials for forming the semiconductor structure 100*d* may be similar to, or the same as, those for forming the semiconductor structure 100 described previously and are not repeated herein.

More specifically, the transmission line 502 electrically connect chip structures 20-1 and 20-2, as shown in FIG. 6 in accordance with some embodiments. In addition, a magnetic structure 400*d* is formed around the transmission line 502 and is spaced apart from the transmission line 502 by the interconnect dielectric layers (e.g. the interconnect dielectric layers 312, 322, and 332 described previously) in accordance with some embodiments. Since the magnetic structure 400*d* is formed around the transmission line 502, the energy loss of the transmission line 502 during operation may be reduced. In addition, the formation of the magnetic structure 400 may be applied to the formation of the interconnect structure (e.g. the interconnect structure 310 described previously) without requiring additional complicated manufacturing processes.

In some embodiments, the magnetic structure 400*d* includes bottom magnetic portions 402-1, 402-2, 402-3, and 402-4, top magnetic portions 408-1, 408-2, 408-3, 408-4, and 408-5, and magnetic portions 406-1, 406-2, 406-3, 406-4, 406-5, 406-6, 406-7, and 406-8. In addition, similar to the structure shown in FIG. 1K-2, each of the magnetic portions 406-1, 406-2, 406-3, 406-4, 406-5, 406-6, 406-7, and 406-8 includes magnetic units 406_U laterally spaced apart from each other in accordance with some embodiments. In some embodiments, the magnetic portions 406-1, 406-3, 406-5, and 406-7 are formed at the first side of the transmission line 502, and the magnetic portions 406-2, 406-4, 406-6, and 406-8 are formed at second side of the transmission line 502.

In some embodiments, the top portion of the magnetic portion 406-1 is physically connected to the top magnetic portion 408-1, and the bottom portion of the magnetic portion 406-1 is physically connected to the bottom magnetic portion 402-1. In some embodiments, the top portion of the magnetic portion 406-2 is physically connected to the top magnetic portion 408-2, and the bottom portion of the magnetic portion 406-2 is physically connected to the bottom magnetic portion 402-1. In some embodiments, the top portion of the magnetic portion 406-3 is physically connected to the top magnetic portion 408-2, and the bottom portion of the magnetic portion 406-3 is physically connected to the bottom magnetic portion 402-2. In some embodiments, the top portion of the magnetic portion 406-4 is physically connected to the top magnetic portion 408-3, and the bottom portion of the magnetic portion 406-4 is physically connected to the bottom magnetic portion 402-2.

In some embodiments, the top portion of the magnetic portion 406-5 is physically connected to the top magnetic portion 408-3, and the bottom portion of the magnetic portion 406-5 is physically connected to the bottom magnetic portion 402-3. In some embodiments, the top portion of the magnetic portion 406-6 is physically connected to the top magnetic portion 408-4, and the bottom portion of the magnetic portion 406-6 is physically connected to the bottom magnetic portion 402-3. In some embodiments, the top portion of the magnetic portion 406-7 is physically connected to the top magnetic portion 408-4, and the bottom portion of the magnetic portion 406-7 is physically connected to the bottom magnetic portion 402-4. In some embodiments, the top portion of the magnetic portion 406-8 is physically connected to the top magnetic portion 408-5, and the bottom portion of the magnetic portion 406-8 is physically connected to the bottom magnetic portion 402-4.

In some embodiments, the transmission line 502 includes portions 502-1, 502-2, and 502-3 extending along different directions. In some embodiments, the portion 502-1 is longitudinally oriented along a first direction, the portion 502-2 is longitudinally oriented along a second direction, and the portion 502-3 is longitudinally oriented along a third direction. In some embodiments, the top magnetic portion 408-1 and the bottom magnetic portion 402-1 partially overlap the portion 502-1 of the transmission line 502 and are longitudinally oriented along a fourth direction and a fifth direction, respectively. In some embodiments, the first direction, the fourth direction, and the fifth direction are different from each other.

In some embodiments, the top magnetic portion 408-2 and the bottom magnetic portion 402-2 partially overlap the portion 502-2 of the transmission line 502 and are longitudinally oriented along a six direction and a seventh direction, respectively. In some embodiments, the second direction, the six direction, and the seventh direction are different from each other. In addition, the top magnetic portion 408-3 and the bottom magnetic portion 402-3 are also longitudinally oriented along the six direction and the seventh direction, respectively in accordance with some embodiments.

In some embodiments, the top magnetic portion 408-4 and the bottom magnetic portion 402-3 partially overlap the portion 502-3 of the transmission line 502 and are longitudinally oriented along an eighth direction and a ninth direction, respectively. In some embodiments, the third direction, the eighth direction, and the ninth direction are different from each other. In addition, the top magnetic portion 408-5 is longitudinally oriented along the tenth direction. The tenth direction is different from the third direction and the eight direction. In some embodiments, the bottom magnetic portion 402-4 vertically overlaps both portions 502-2 and 502-3 of the transmission line 502.

By forming the magnetic portions extending along different directions, the resulting magnetic structure **400*d* may be more stable and has a great reliability. In addition, the arrangement of the magnetic portions may have a greater flexibility, and therefore the magnetic structure 400*d*** may be applied to various layouts (e.g. a transmission line with bending shapes) without requiring additional complicated manufacturing processes.

Figure 7:
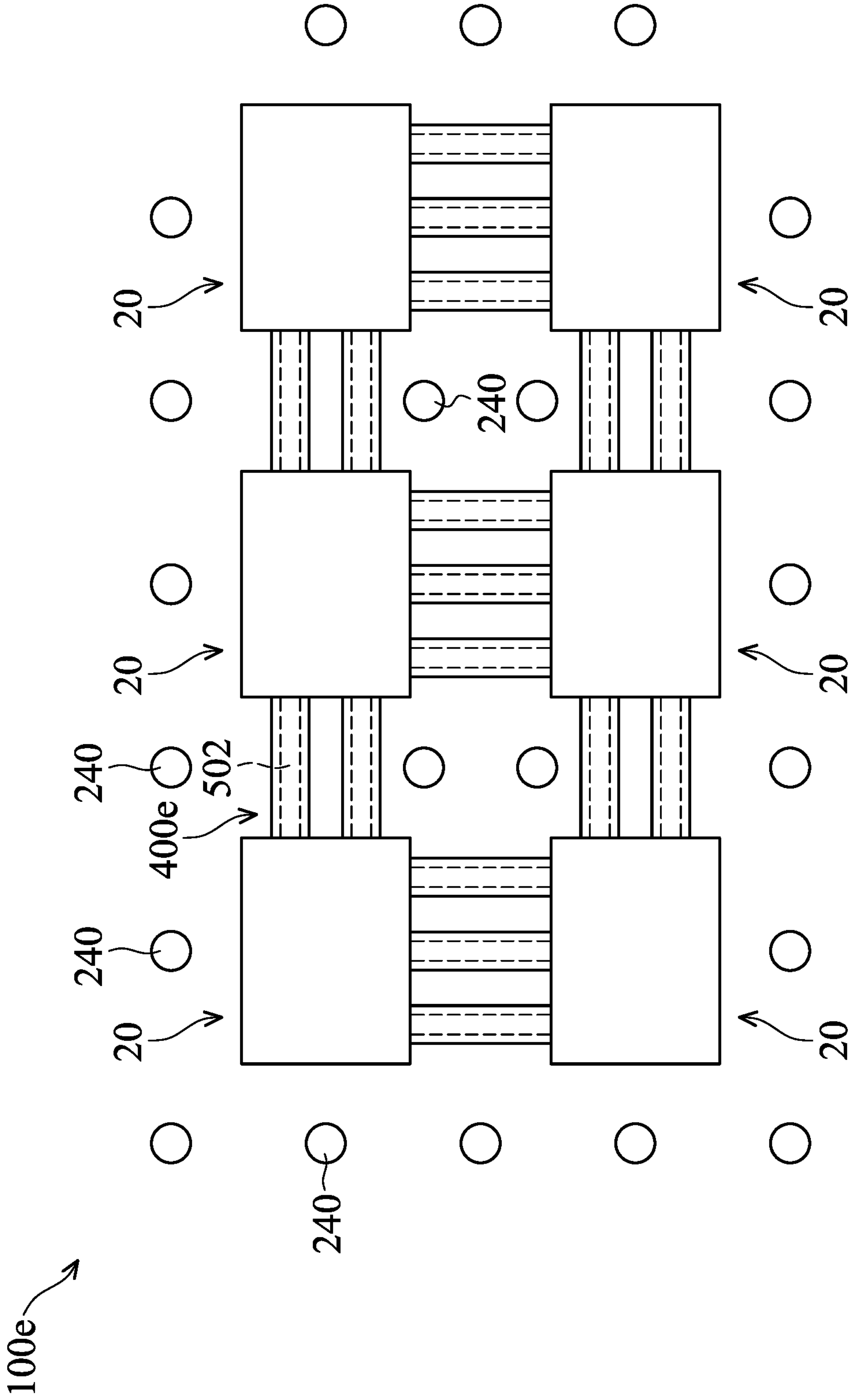
FIG. 7 illustrates a diagrammatic top view of a package structure in accordance with some embodiments.

FIG. 7 illustrates a diagrammatic top view of a package structure **100*e* in accordance with some embodiments. The package structure 100*e* may include the package structures 100, 100*a*, 100*b*, 100*c*, or 100*d* described previously. Processes and materials for forming the package structure 100*e* may be similar to, or the same as, those for forming the package structures 100, 100*a*, 100*b*, 100*c*, or 100*d*** described previously and are not repeated herein.

More specifically, the package structure **100*e* includes a number of chip structures 20, and transmission lines 502 are used to connect the chip structures 20, as shown in FIG. 7 in accordance with some embodiments. In addition, magnetic structures 400*e* are formed around the transmission line 502, so that the energy consumption of the resulting package structure 100*e* may be reduced. The magnetic structures 400*e* may have the structure the same as those of the magnetic structures 400, 400', 400*a* to 400*c*, 400-3*a* to 400-3*c*, 400-4*a*, 400-4*b*, 400-5*a* to 400-5*g*, and 400*d* described previously. In addition, the magnetic structures 400*e*** may have different structures at different regions.

Figure 8:
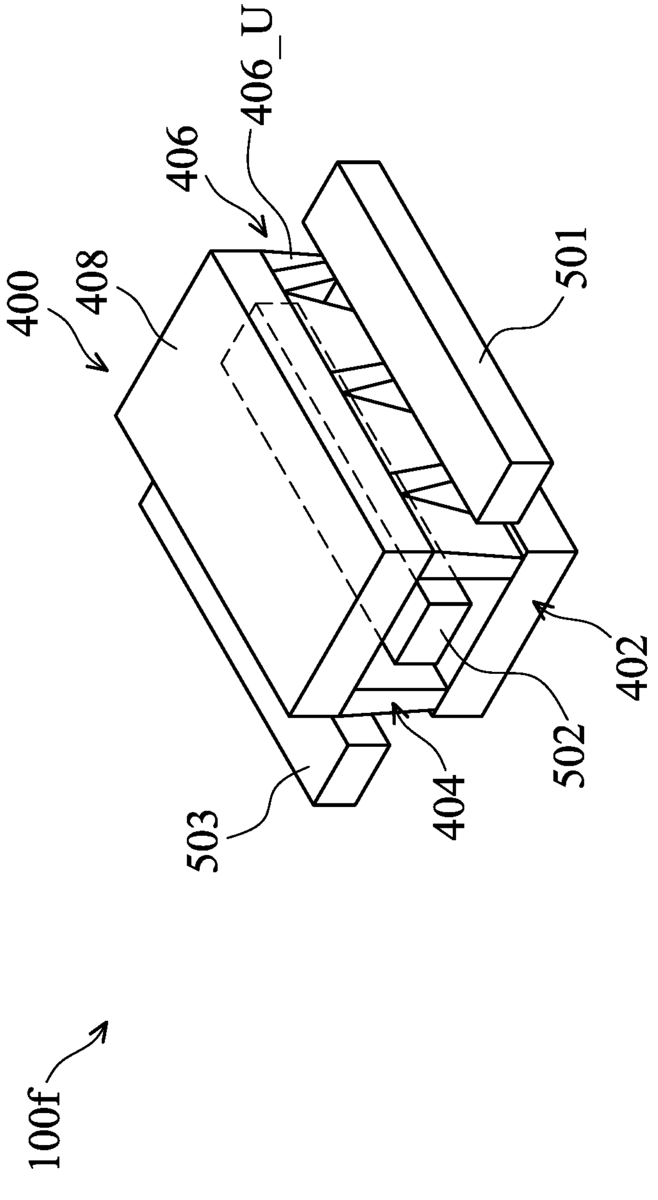
FIG. 8 illustrates a diagrammatic perspective view of a package structure in accordance with some embodiments.

FIG. 8 illustrates a diagrammatic perspective view of a package structure **100*f* in accordance with some embodiments. The package structure 100*f* may include the package structures 100, 100*a*, 100*b*, 100*c*, or 100*d* described previously. Processes and materials for forming the package structure 100*e* may be similar to, or the same as, those for forming the package structures 100, 100*a*, 100*b*, 100*c*, or 100*d*** described previously and are not repeated herein.

More specifically, the package structure **100*f* includes the transmission line 502 and metal lines 501 and 503 formed in the same interconnect dielectric layer (e.g. the interconnect dielectric layer 332) in ac. Similar to those described above, the magnetic structure 400 is formed around the transmission line 502. On the other hand, the metal lines 501 and 503 are configured to connect to the ground voltage, and therefore magnetic structures are not formed around them. The structures shown in FIG. 8 may also be applied to the package structures 100, 100*a*, 100*b*, 100*c*, or 100*d* described previously. In addition, the magnetic structure 400 shown in the package structure 100*f*** may be replaced by any kinds of magnetic structures described previously.

Generally, a transmission line, such as for 5G/6G high clock frequency (>10 GBPS) transmission line, may be formed in a package structure to connect chip structures. During the operation, electromagnetic radiation will be emitted. In addition, the higher the frequency is, the more the electromagnetic radiation is emitted. Therefore, when the transmission line is applied in the package structure, it may result in increasing the energy loss. Accordingly, in some embodiments of the present application, magnetic structures (e.g. the magnetic structures 400, 400', **400*a* to 400*c*, 400-3*a* to 400-3*c*, 400-4*a*, 400-4*b*, 400-5*a* to 400-5*g*, and 400*d*) are formed adjacent to the transmission line (e.g. the transmission line 502**) to reduce such energy loss. More specifically, the electromagnetic radiation emitted from the transmission line may be reflected by the magnetic materials of the magnetic structures, and therefore the electromagnetic radiation may be confined in a relative small area. That is, it may function as the current mirror and impedance matching for the package structures, such as at two ends of a coplanar waveguide (CPW) transmission line between two AI chips.

Accordingly, the energy loss resulting from the electromagnetic radiation during the operation may be reduced, and the characteristic impedance of transmission line and the magnetic flux for the packaging processes may be increased. In addition, the current and power consumptions of current amplifier with high characteristic impedance of transmission line may be reduced. Furthermore, specific transmission line length can be shortened due to the formation of the magnetic structure. In addition, since the magnetic structures are formed as a shelter for the transmission line, the magnetic structures are electrically isolated from the conductive structures and the electrical devices formed in the package structure in accordance with some embodiments.

In addition, it should be noted that same elements in FIGS. 1A to 8 may be designated by the same numerals and may include materials that are the same or similar and may be formed by processes that are the same or similar; therefore such redundant details are omitted in the interests of brevity. In addition, although FIGS. 1A to 8 are described in relation to the method, it will be appreciated that the structures disclosed in FIGS. 1A to 8 are not limited to the method but may stand alone as structures independent of the method. Similarly, the methods shown in FIGS. 1A to 8 are not limited to the disclosed structures but may stand alone independent of the structures.

Also, while the disclosed methods are illustrated and described above as a series of acts or events, it should be appreciated that the illustrated ordering of such acts or events may be altered in some other embodiments. For example, some acts may occur in a different order and/or concurrently with other acts or events apart from those illustrated and/or described above. In addition, not all illustrated acts may be required to implement one or more aspects or embodiments of the description above. Furthermore, one or more of the acts depicted above may be carried out as one or more separate acts and/or phases.

Furthermore, the terms “approximately,” “substantially,” “substantial” and “about” used above account for small variations and may be varied in different technologies and be within the deviation range understood by the skilled in the art. For example, when used in conjunction with an event or circumstance, the terms can refer to instances in which the event or circumstance occurs precisely as well as instances in which the event or circumstance occurs in a close approximation.

Embodiments for forming package structures may be provided. The package structure may include a chip structure bonded to a substrate through dielectric-to-dielectric bonding and metal-to-metal bonding. In addition, an interconnect structure is formed over the chip structure, and a transmission line is formed in the interconnect structure. In addition, a magnetic structure is formed adjacent to the transmission line so that the energy loss of the transmission line during operation may be reduced. Accordingly, the energy consumption of the resulting device may also be reduced.

In some embodiments, a package structure is provided. The package structure includes a chip structure bonded to a substrate through dielectric-to-dielectric bonding and metal-to-metal bonding and interconnect dielectric layers formed over the chip structure. The package structure further includes interconnect conductive structures formed in the interconnect dielectric layers and a transmission line formed in the interconnect dielectric layers. The package structure further includes a magnetic structure formed in the interconnect dielectric layers and separated from the transmission line by the interconnect dielectric layers. In addition, the magnetic structure is electrically isolated from the chip structure and the interconnect conductive structures.

In some embodiments, a package structure is provided. The package structure includes a chip structure bonded to a substrate through dielectric-to-dielectric bonding and metal-to-metal bonding and a dielectric layer formed over the substrate and covering sidewall surfaces of the chip structure. The package structure further includes through dielectric vias formed through the dielectric layer and an interconnect structure formed over the dielectric layer and the chip structure. In addition, the interconnect structure includes a transmission line that is electrically connected to the chip structure and a magnetic structure that is spaced apart from the transmission line by a first space. In addition, the magnetic structure is electrically isolated from the transmission line, the chip structure, and the through dielectric vias. The interconnect structure further includes interconnect dielectric layers formed around the transmission line and the magnetic structure, and the first space between the magnetic structure and the transmission line is filled by the interconnect dielectric layers.

In some embodiments, a method for manufacturing a package structure is provided. The method includes forming a first bonding structure over a substrate, and the first bonding structure includes a first dielectric layer and first conductive pads formed in the first dielectric layer. The method further includes bonding a second bonding structure of a chip structure to the first bonding structure, and the second bonding structure includes a second dielectric layer and second conductive pads formed in the second dielectric layer, and the second conductive pads are bonded to the first conductive pads, and the second dielectric layer is bonded to the first dielectric layer. The method further includes forming a third dielectric layer over the first bonding structure and around the chip structure and forming through dielectric vias through the third dielectric layer and electrically connected to the first conductive pads. The method further includes forming an interconnect structure over the third dielectric layer, including forming a first interconnect dielectric layer and forming a second interconnect dielectric layer over the first interconnect dielectric layer. In addition, a transmission line is formed in the second interconnect dielectric layer. The method further includes forming a third interconnect dielectric layer over the second interconnect dielectric layer and forming a first magnetic portion through the first interconnect dielectric layer, the second interconnect dielectric layer, and the third interconnect dielectric layer. In addition, the transmission line is electrically connected to the chip structure and is electrically isolated from the first magnetic portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a chip structure bonded to a bonding structure over a substrate through dielectric-to-dielectric bonding and metal-to-metal bonding;
a dielectric layer laterally surrounding the chip structure;
interconnect dielectric layers formed over the chip structure;
interconnect conductive structures formed in the interconnect dielectric layers;
a transmission line formed in the interconnect dielectric layers; and
a magnetic structure formed in the interconnect dielectric layers and separated from the transmission line by the interconnect dielectric layers, wherein the magnetic structure is electrically isolated from the chip structure and the interconnect conductive structures, and the dielectric layer continuously extends from a bottom surface of the magnetic structure to a top surface of the bonding structure.

2. The package structure as claimed in claim 1, wherein the magnetic structure comprises:
a first magnetic portion formed at a first side of the transmission line; and
a second magnetic portion formed at a second side of the transmission line, wherein the first side is opposite the second side,
wherein a distance between the first magnetic portion and the second magnetic portion in a first direction is greater than a dimension of the transmission line in the first direction.

3. The package structure as claimed in claim 2, wherein a distance between the first magnetic portion and a first sidewall of the transmission line at the first side is different from a distance between the second magnetic portion and a second sidewall of the transmission line at the second side.

4. The package structure as claimed in claim 2, wherein the first magnetic portion and the second magnetic portion are made of different materials.

5. The package structure as claimed in claim 2, wherein the magnetic structure further comprises:
a third magnetic portion formed at a third side of the transmission line, wherein the third magnetic portion is in direct contact with both the first magnetic portion and the second magnetic portion.

6. The package structure as claimed in claim 5, wherein the third magnetic portion further comprises third magnetic units laterally spaced apart from each other.

7. The package structure as claimed in claim 6, wherein each of the third magnetic units has a top width and a bottom width, and the top width is greater than the bottom width.

8. A package structure, comprising:
a chip structure bonded to a substrate through dielectric-to-dielectric bonding and metal-to-metal bonding;
a dielectric layer formed over the substrate and covering sidewall surfaces of the chip structure;
through dielectric vias formed through the dielectric layer; and
an interconnect structure formed over the dielectric layer and the chip structure, wherein the interconnect structure comprises:
a transmission line electrically connect to the chip structure;
a magnetic structure spaced apart from the transmission line by a first space, wherein the magnetic structure partially overlaps with the chip structure and partially overlaps with the dielectric layer, and the magnetic structure is electrically isolated from the transmission line, the chip structure, and the through dielectric vias; and
interconnect dielectric layers formed around the transmission line and the magnetic structure, wherein the first space between the magnetic structure and the transmission line is filled by the interconnect dielectric layers.

9. The package structure as claimed in claim 8, wherein the magnetic structure comprises:
a first top magnetic portion over the transmission line;
a first bottom magnetic portion below the transmission line; and
first magnetic units spaced apart from each other in a first direction and connecting the first top magnetic portion and the first bottom magnetic portion in a second direction.

10. The package structure as claimed in claim 9, wherein a width of each of the first magnetic units gradually decreases in the second direction.

11. The package structure as claimed in claim 9, wherein the first top magnetic portion is longitudinally oriented along a third direction, and the first bottom magnetic portion is longitudinally oriented along a fourth direction, wherein the fourth direction is different from the third direction.

12. The package structure as claimed in claim 9, wherein the magnetic structure further comprises:
a second top magnetic portion overlapping the transmission line and spaced apart from the first top magnetic portion; and
second magnetic units spaced apart from each other in the first direction and connected to the second top magnetic portion and the first bottom magnetic portion in the second direction.

13. The package structure as claimed in claim 12, wherein the magnetic structure further comprises:
a second bottom magnetic portion below the transmission line and spaced apart from the first bottom magnetic portion; and
third magnetic units spaced apart from each other in the first direction and connected to the second top magnetic portion and the second bottom magnetic portion in the second direction,
wherein the first magnetic units and the third magnetic units are at a first side of the transmission line, and the second magnetic units are at a second side of the transmission line opposite the first side.

14. The package structure as claimed in claim 8, wherein the magnetic structure is in direct contact with the chip structure.

15. A method for forming a package structure, comprising:
forming a first bonding structure over a substrate, wherein the first bonding structure comprises a first dielectric layer and first conductive pads formed in the first dielectric layer;
bonding a second bonding structure of a chip structure to the first bonding structure, wherein the second bonding structure comprises a second dielectric layer and second conductive pads formed in the second dielectric layer, and the second conductive pads are bonded to the first conductive pads, and the second dielectric layer is bonded to the first dielectric layer;
forming a third dielectric layer over the first bonding structure and around the chip structure;

forming through dielectric vias through the third dielectric layer and electrically connected to the first conductive pads;

forming an interconnect structure over the third dielectric layer, comprising:

forming a first interconnect dielectric layer;

forming a second interconnect dielectric layer over the first interconnect dielectric layer, wherein a transmission line is formed in the second interconnect dielectric layer;

forming a third interconnect dielectric layer over the second interconnect dielectric layer; and forming a first magnetic portion through the first interconnect dielectric layer, the second interconnect dielectric layer, and the third interconnect dielectric layer, wherein the transmission line is electrically connected to the chip structure and is electrically isolated from the first magnetic portion.

16. The method for forming the package structure as claimed in claim 15, wherein forming the interconnect structure over the third dielectric layer further comprises:

forming a second magnetic portion through the first interconnect dielectric layer, the second interconnect dielectric layer, and the third interconnect dielectric layer, wherein the second magnetic portion and the first magnetic portion are at opposite sides of the transmission line.

17. The method for forming the package structure as claimed in claim 15, wherein forming the interconnect structure over the third dielectric layer further comprises:

forming a fourth interconnect dielectric layer over the third interconnect dielectric layer; and forming a third magnetic portion in the fourth interconnect dielectric layer, wherein the third magnetic portion is in contact with a top portion of the first magnetic portion, and the third interconnect dielectric layer is vertically sandwiched between the transmission line and the third magnetic portion.

18. The method for forming the package structure as claimed in claim 17, wherein forming the interconnect structure over the third dielectric layer further comprises:

forming a fifth interconnect dielectric layer over the third dielectric layer; and forming a fourth magnetic portion in the fifth interconnect dielectric layer, wherein the fourth magnetic portion is in contact with a bottom portion of the first magnetic portion, and the first interconnect dielectric layer is vertically sandwiched between the transmission line and the fourth magnetic portion.

19. The method for forming the package structure as claimed in claim 15, wherein the first magnetic portion comprises first magnetic units formed at a same side of the transmission line.

20. The package structure as claimed in claim 1, wherein the magnetic structure comprises a first portion over a top surface of the chip structure and a second portion over a top surface of the dielectric layer.

* * * * *